US012764931B2

(12) United States Patent
Lee et al.

(10) Patent No.: US 12,764,931 B2
(45) Date of Patent: Oct. 13, 2026

(54) SEMICONDUCTOR MEMORY DEVICE INCLUDING GATE INSULATING PATTERN INCLUDING HIGH-K DIELECTRIC MATERIAL

(71) Applicant: Samsung Electronics Co., Ltd., Suwon-si (KR)

(72) Inventors: Sangho Lee, Suwon-si (KR); Moonyoung Jeong, Suwon-si (KR); Ilgweon Kim, Suwon-si (KR); Yoongi Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 301 days.

(21) Appl. No.: 18/480,389

(22) Filed: Oct. 3, 2023

(65) Prior Publication Data

US 2024/0334677 A1 Oct. 3, 2024

(30) Foreign Application Priority Data

Mar. 31, 2023 (KR) ........................ 10-2023-0042985

(51) Int. Cl.
*H10B 12/00* (2023.01)

(52) U.S. Cl.
CPC ........... *H10B 12/315* (2023.02); *H10B 12/05* (2023.02)

(58) Field of Classification Search
CPC .. H10B 12/315; H10B 12/482; H10B 12/312; H10B 12/488
See application file for complete search history.

(56) References Cited

U.S. PATENT DOCUMENTS 7,646,057 B2 1/2010 Jung
9,577,052 B2 2/2017 Oh
(Continued)

FOREIGN PATENT DOCUMENTS

CN 102376712 A * 3/2012 ........... H10D 62/116
KR 10-2006-0023679 A 3/2006
(Continued)

OTHER PUBLICATIONS

Amit Das et al., Impact of Reverse Gate Oxide Stacking on Gate All Around Tunnel FET for High Frequency Analog and RF Applications, IEEE 17th India Council International Conference (INDICON) (2020), 1-6.
(Continued)

*Primary Examiner* — Mamadou L Diallo
(74) *Attorney, Agent, or Firm* — HARNESS, DICKEY & PIERCE, P.L.C.

(57) ABSTRACT

A semiconductor memory device includes a bit line, first and second word lines spaced apart from each other on the bit line, a back gate electrode between the first and second word lines, a first active pattern between the first word line and the back gate electrode, a second active pattern between the second word line and the back gate electrode, contact patterns connected to the first and second active patterns, respectively, and a first gate insulating pattern between the first active pattern and the first word line and between the second active pattern and the second word line. A top surface of the first gate insulating pattern is located at substantially a same height as top surfaces of the first and second word lines. The first gate insulating pattern includes a high-k dielectric material.

20 Claims, 34 Drawing Sheets

(56) References Cited

U.S. PATENT DOCUMENTS

| | | | | |
|---|---|---|---|---|
| 9,806,028 | B2 * | 10/2017 | Lee | H10N 70/8833 |
| 11,980,024 | B2 * | 5/2024 | Luo | H10B 12/315 |
| 12,494,397 | B2 * | 12/2025 | Kim | G11C 11/4097 |
| 2016/0181377 | A1 * | 6/2016 | Oh | H10B 61/22 438/421 |
| 2019/0081180 | A1 | 3/2019 | Park et al. | |
| 2020/0176611 | A1 | 6/2020 | Lee et al. | |
| 2022/0189972 | A1 | 6/2022 | Lee et al. | |
| 2022/0246180 | A1 * | 8/2022 | Lee | H10B 12/488 |
| 2023/0005919 | A1 * | 1/2023 | Xiao | H10B 12/05 |
| 2023/0055147 | A1 * | 2/2023 | Lee | H10D 30/6728 |
| 2023/0320068 | A1 * | 10/2023 | Kim | H10B 12/05 257/296 |
| 2023/0320077 | A1 | 10/2023 | Jeong et al. | |
| 2023/0413524 | A1 * | 12/2023 | Kim | H10B 12/488 |
| 2024/0049457 | A1 * | 2/2024 | Xiao | H10B 12/02 |
| 2024/0215219 | A1 * | 6/2024 | Song | H10B 12/053 |

FOREIGN PATENT DOCUMENTS

| | | | | |
|---|---|---|---|---|
| KR | 100848242 | B1 | 7/2008 | |
| KR | 10-2012-0052076 | A | 5/2012 | |
| KR | 10-2016-0073133 | A | 6/2016 | |
| KR | 10-2019-0029942 | A | 3/2019 | |
| KR | 102283813 | B1 * | 8/2021 | H01L 21/76801 |
| KR | 10-2022-0085646 | A | 6/2022 | |
| KR | 10-2023-0140962 | A | 10/2023 | |

OTHER PUBLICATIONS

Mridul Jain et al., A Hetero-Dielectric Double-Gate Junctionless FET with Spacer for Improved Device Performances, Devices for Integrated Circuit (DevIC), 2021, pp. 116-119.

* cited by examiner

SEMICONDUCTOR MEMORY DEVICE INCLUDING GATE INSULATING PATTERN INCLUDING HIGH-K DIELECTRIC MATERIAL

CROSS-REFERENCE TO RELATED APPLICATIONS

This U.S. non-provisional patent application claims priority under 35 U.S.C. § 119 to Korean Patent Application No. 10-2023-0042985, filed on Mar. 31, 2023, in the Korean Intellectual Property Office, the entire contents of which are hereby incorporated by reference.

BACKGROUND OF THE INVENTION

The present disclosure relates to semiconductor memory devices, and more particularly, to semiconductor memory devices with improved electrical characteristics and reliability.

An electronic system requiring data storage may require a semiconductor device capable of storing high-capacity data. To meet excellent performance and low price of a semiconductor device while increasing data storage capacity of the semiconductor device, it may be required to increase an integration density of the semiconductor device. An integration density of a two-dimensional (2D) or planar semiconductor device may be mainly determined by an area where a unit memory cell occupies, and thus the integration density of the 2D or planar semiconductor device may be greatly affected by a technique of forming fine patterns. However, since extremely high-priced apparatuses are needed to form fine patterns, the integration density of 2D semiconductor devices continues to increase but is still limited. Thus, semiconductor memory devices have been developed to improve their integration density, resistance and current driving capability.

SUMMARY

Example embodiments of the inventive concepts may provide semiconductor memory devices with improved electrical characteristics and reliability.

In an example embodiments, a semiconductor memory device may include a bit line extending in a first direction, a first word line and a second word line which extend in a second direction intersecting the first direction on the bit line and the first word line and the second word line are spaced apart from each other in the first direction, a back gate electrode extending in the second direction between the first word line and the second word line, a first active pattern between the first word line and the back gate electrode, a second active pattern between the second word line and the back gate electrode, contact patterns connected to the first active pattern and the second active pattern, respectively, and a first gate insulating pattern between the first active pattern and the first word line and between the second active pattern and the second word line. A top surface of the first gate insulating pattern may be located at substantially the same height as a top surface of the first word line and a top surface of the second word line. The first gate insulating pattern may include a high-k dielectric material.

In an example embodiment, a semiconductor memory device may include a bit line extending in a first direction, word lines extending in a second direction intersecting the first direction on the bit line and spaced apart from each other in the first direction, a back gate electrode extending in the second direction between the word lines, active patterns, each of which is between each of the word lines and the back gate electrode, contact patterns connected to the active patterns, respectively, and a gate insulating pattern covering a side surface of each of the active patterns. The gate insulating pattern may include a first gate insulating pattern on a top surface of the bit line, and a second gate insulating pattern on the first gate insulating pattern. The first gate insulating pattern may include a material having a dielectric constant higher than that of the second gate insulating pattern.

In an example embodiment, a semiconductor memory device may include a substrate, a bit line extending in a first direction on the substrate, word lines extending in a second direction intersecting the first direction on the bit line and spaced apart from each other in the first direction, active patterns between the word lines on the bit line, contact patterns connected to the active patterns, respectively, and a gate insulating pattern between each of the active patterns and an adjacent one of the word lines. The gate insulating pattern may include a first gate insulating pattern on a top surface of the bit line, and a second gate insulating pattern on the first gate insulating pattern. The first gate insulating pattern may include a material having a dielectric constant higher than that of the second gate insulating pattern.

DETAILED DESCRIPTION

Example embodiments of the inventive concepts will now be described more fully with reference to the accompanying drawings.

Figure 1:
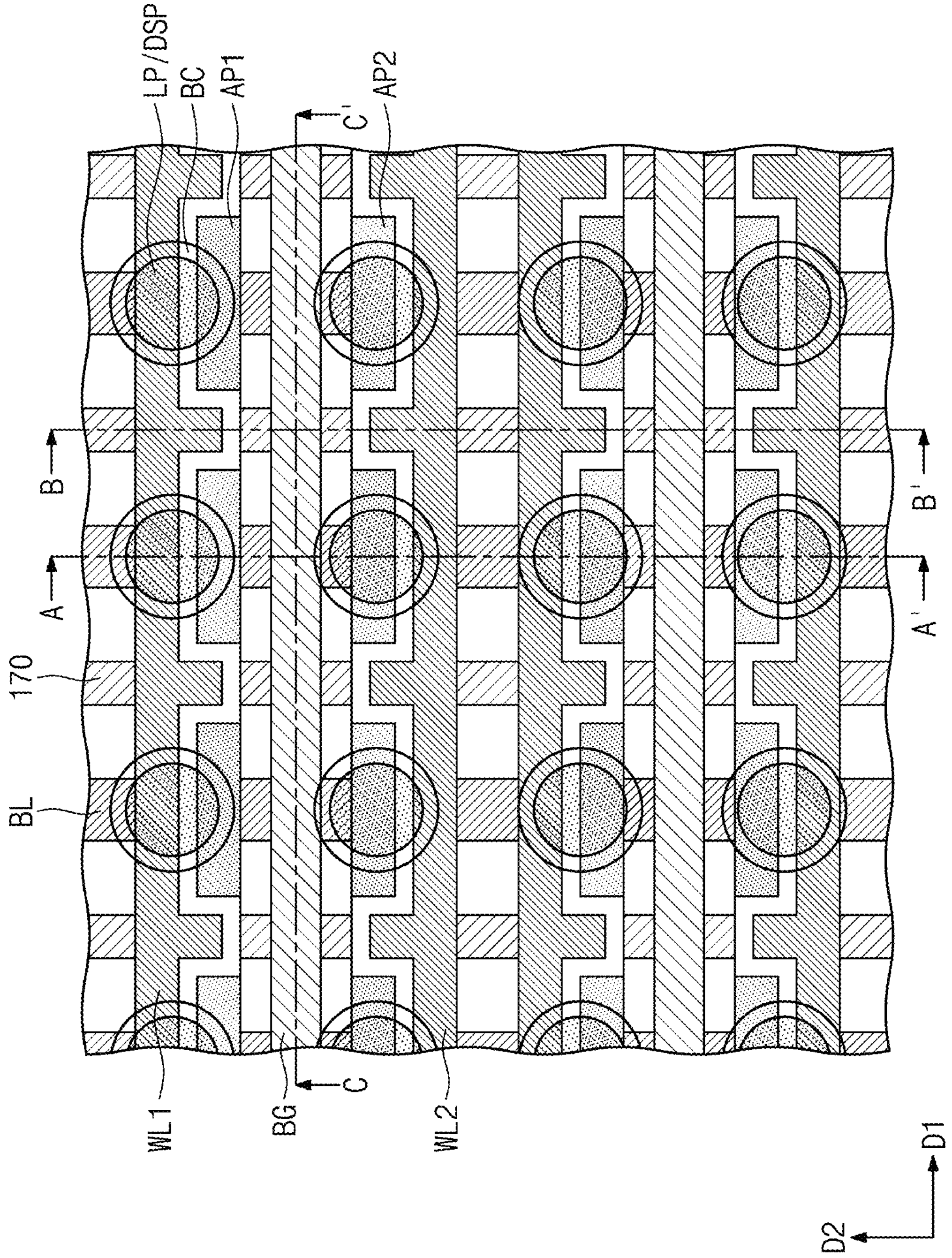
FIG. 1 is a plan view illustrating a semiconductor memory device according to some example embodiments of the inventive concepts.
Figure 2A:
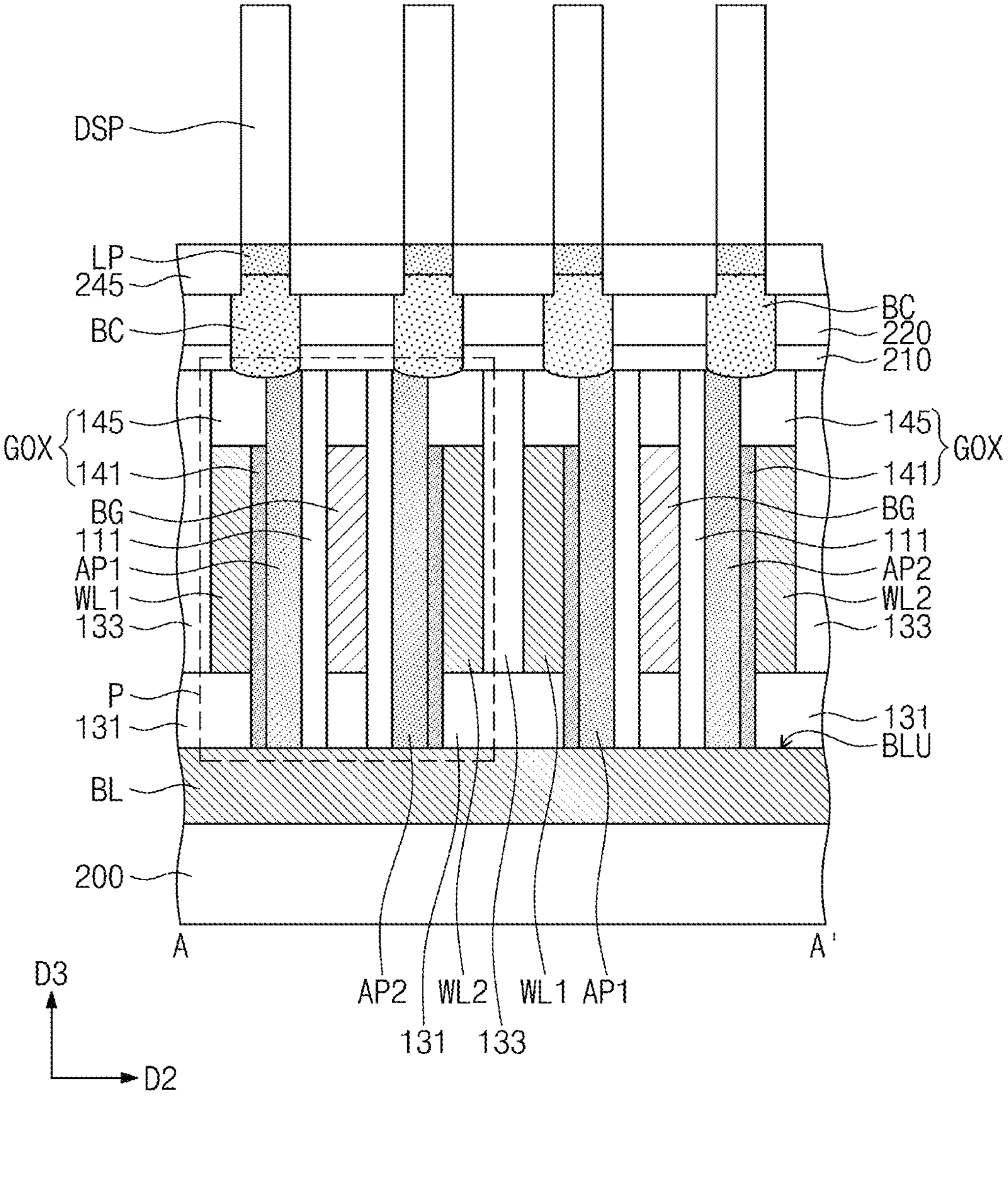
FIGS. 2A, 2B and 2C are cross-sectional views taken along lines A-A', B-B' and C-C' of FIG. 1, respectively, to illustrate a semiconductor memory device according to some example embodiments of the inventive concepts.
Figure 2B:
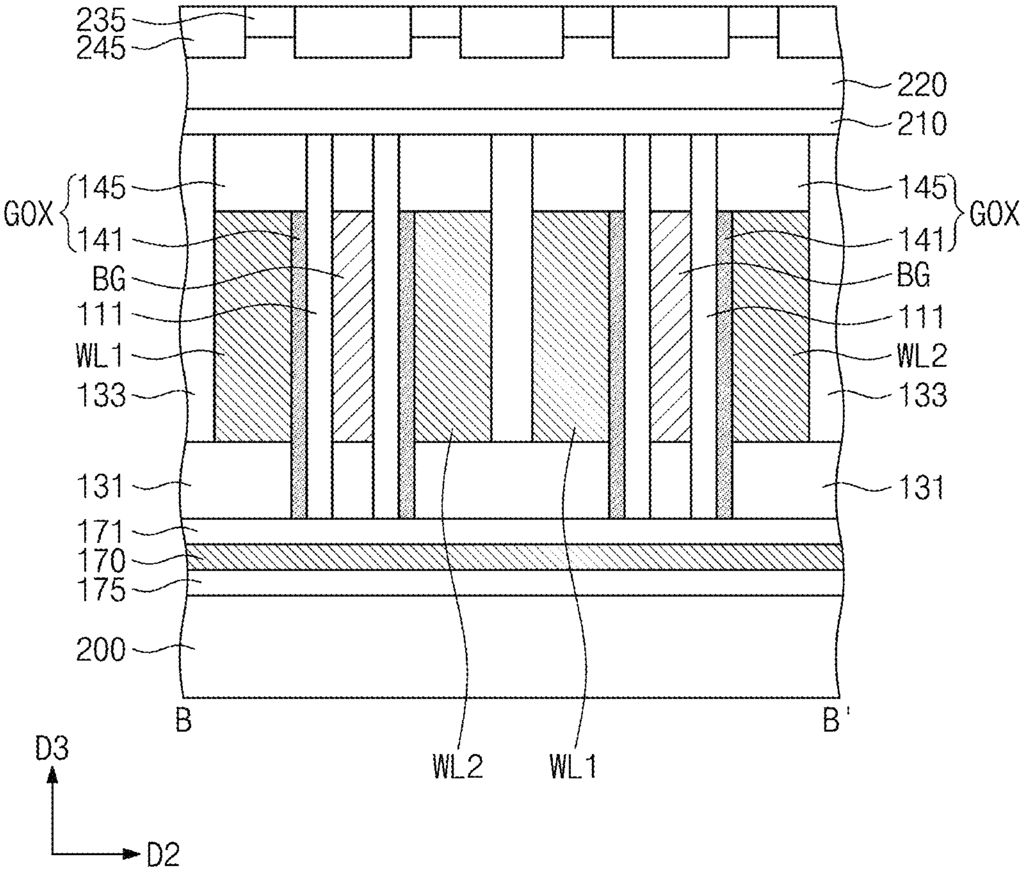
Figure 2C:
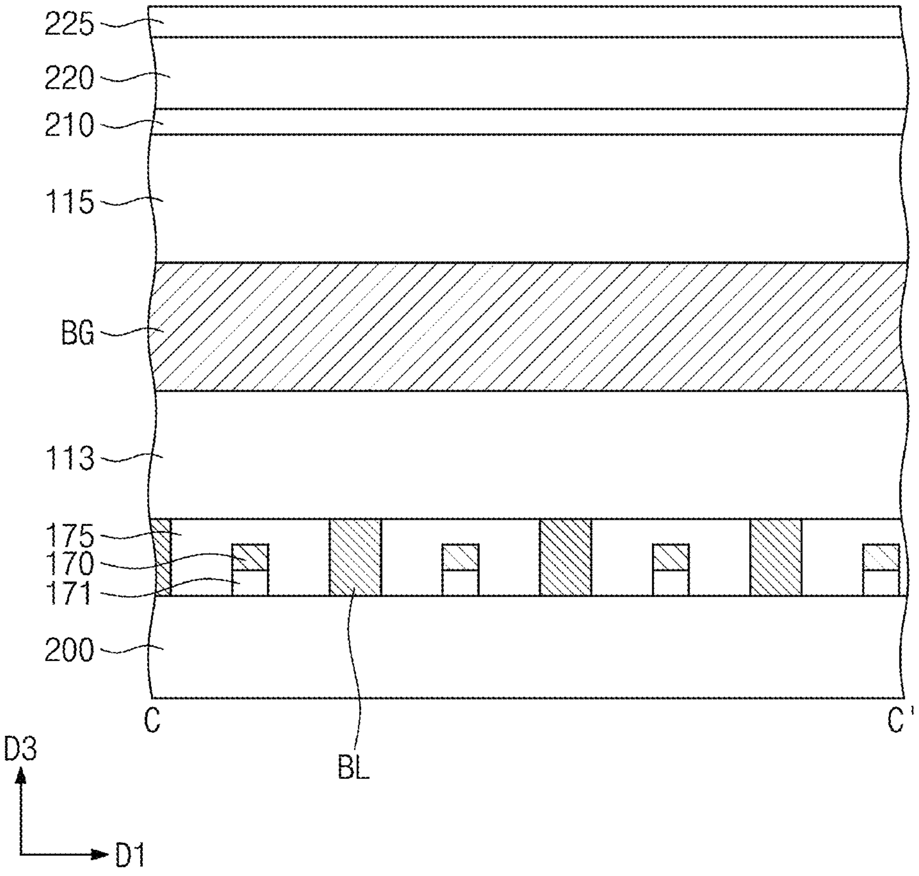
Figure 3A:
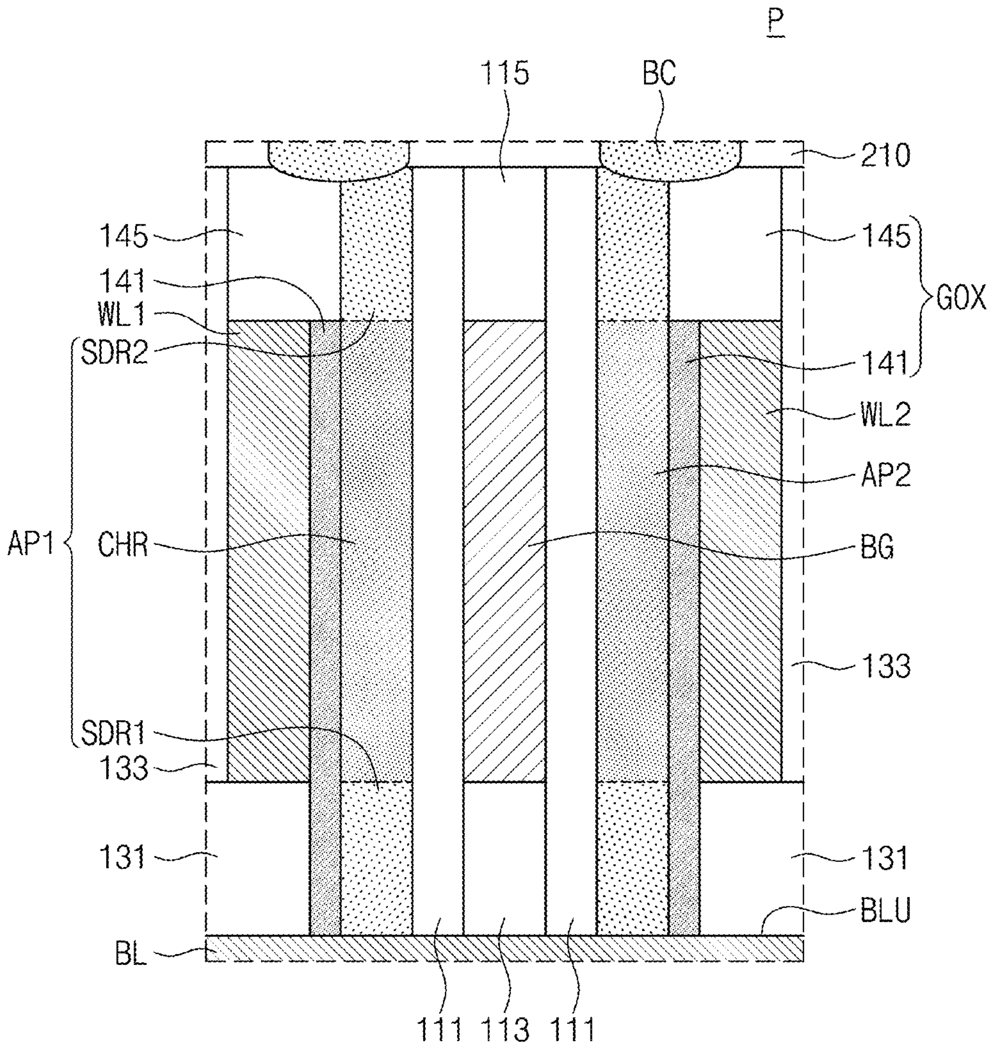
FIG. 3A is an enlarged view of a portion 'P' of FIG. 2A to illustrate a portion of a semiconductor memory device according to some example embodiments of the inventive concepts.

FIG. 1 is a plan view illustrating a semiconductor memory device according to some embodiments of the inventive concepts. FIGS. 2A, 2B and 2C are cross-sectional views taken along lines A-A', B-B' and C-C' of FIG. 1, respectively, to illustrate a semiconductor memory device according to some example embodiments of the inventive concepts. FIG. 3A is an enlarged view of a portion ‘P’ of FIG. 2A to illustrate a portion of a semiconductor memory device according to some example embodiments of the inventive concepts.

Referring to FIGS. 1 and 2A to 2C, bit lines BL may be disposed on a substrate 200 and may be spaced apart from each other in a first direction D1. The bit lines BL may extend in parallel to each other in a second direction D2 intersecting the first direction D1.

The substrate 200 may include a material (e.g., a silicon wafer) having semiconductor properties, an insulating material (e.g., glass), or a semiconductor or conductor covered by an insulating material.

For example, the bit lines BL may include at least one of, but not limited to, doped poly-silicon, a metal (e.g., Al, Cu, Ti, Ta, Ru, W, Mo, Pt, Ni, or Co), a conductive metal nitride (e.g., TiN, TaN, WN, NbN, TiAlN, TiSiN, TaSiN, or RuTiN), a conductive metal silicide, or a conductive metal oxide (e.g., PtO, $RuO_2$, $IrO_2$, $SrRuO_3$ (SRO), $(Ba,Sr)RuO_3$ (BSRO), $CaRuO_3$ (CRO), or LSCo). The bit lines BL may include a single layer or multi-layer of the aforementioned materials. In certain example embodiments, the bit lines BL may include a two-dimensional material, and for example, the two-dimensional material may include graphene, carbon nanotube, or a combination thereof.

In some example embodiments, the semiconductor memory device may include gap structures 170 between the bit lines BL. Each of the gap structures 170 may be surrounded by line insulating layers 171 and 175.

The gap structures 170 may extend in the second direction D2 in parallel to each other. The gap structures 170 may be provided in the line insulating layers 171 and 175, and top surfaces of the gap structures 170 may be located at a lower level than top surfaces of the bit lines BL.

In some example embodiments, each of the gap structures 170 may be formed of a conductive material and may include an air gap or a void therein. In certain example embodiments, the gap structures 170 may be air gaps surrounded by the line insulating layers 171 and 175. Each of the gap structures 170 may reduce coupling noise between the bit lines BL adjacent to each other. For example, the gap structures 170 may be shielding lines formed of a conductive material.

Active patterns AP may be disposed on the bit lines BL. The active patterns AP may include first active patterns AP1 and second active patterns AP2. The first and second active patterns AP1 and AP2 may be alternately arranged in the second direction D2 on each of the bit lines BL. The first active patterns AP1 may be spaced apart from each other in the first direction D1, and the second active patterns AP2 may be spaced apart from each other in the first direction D1. In other words, the first and second active patterns AP1 and AP2 may be two-dimensionally arranged in the first direction D1 and the second direction D2 which intersect each other.

In some example embodiments, the first and second active patterns AP1 and AP2 may be formed of a single-crystalline semiconductor material. For example, the first and second active patterns AP1 and AP2 may be formed of single-crystalline silicon. In certain example embodiments, the first and second active patterns AP1 and AP2 may include at least one of poly-silicon, or a two-dimensional material including IGZO or $MoS_2$.

Each of the first and second active patterns AP1 and AP2 may have a length in the first direction D1, a width in the second direction D2, and a vertical length in a direction (i.e., a third direction D3) perpendicular to the first and second directions D1 and D2. Each of the first and second active patterns AP1 and AP2 may have a substantially uniform width. The width of each of the first and second active patterns AP1 and AP2 may range from several nanometers (nm) to several tens nanometers (nm). For example, the width of each of the first and second active patterns AP1 and AP2 may range from 1 nm to 30 nm (in particular, from 1 nm to 10 nm). The length of each of the first and second active patterns AP1 and AP2 may be greater than a line width of each of the bit lines BL in the first direction D1.

Back gate electrodes BG may be disposed on the bit lines BL and may be spaced apart from each other in the second direction D2 by a certain distance. The back gate electrodes BG may extend in the first direction D1 to intersect the bit lines BL.

Each of the back gate electrodes BG may be disposed between the first and second active patterns AP1 and AP2 adjacent to each other in the second direction D2. In other words, the first active patterns AP1 may be disposed at a side of each of the back gate electrodes BG, and the second active patterns AP2 may be disposed at another side of each of the back gate electrodes BG. The back gate electrodes BG may be spaced apart from the first and second active patterns AP1 and AP2. The back gate electrodes BG and the first and second active patterns AP1 and AP2 may have vertical lengths in the third direction D3, and the vertical lengths of the back gate electrodes BG may be less than the vertical lengths of the first and second active patterns AP1 and AP2.

For example, the back gate electrodes BG may include doped poly-silicon, a conductive metal nitride (e.g., titanium nitride, tantalum nitride, etc.), a metal (e.g., tungsten, titanium, tantalum, etc.), a conductive metal silicide, a conductive metal oxide, or any combination thereof.

When the semiconductor memory device operates, a negative voltage may be applied to the back gate electrodes BG, and thus a threshold voltage of a vertical channel transistor may be increased. In other words, the back gate electrode BG supplied with the negative voltage may prevent or reduce in likelihood a leakage current property of the vertical channel transistor from being deteriorated by reduction in the threshold voltage which may be caused by reduction in size of the vertical channel transistor.

A first insulating pattern 111 may be disposed between the first and second active patterns AP1 and AP2 adjacent to each other in the second direction D2. The first insulating pattern 111 may be disposed on top surfaces of the bit lines BL. The first insulating pattern 111 may extend from the top surfaces of the bit lines BL to an etch stop layer 210 in the third direction D3. The first insulating pattern 111 may extend in the first direction D1 in parallel to the back gate electrodes BG. A distance between a surface of each of the first and second active patterns AP1 and AP2 and the back gate electrode BG may be changed depending on a thickness of the first insulating pattern 111. For example, the first insulating pattern 111 may include a silicon oxide layer, a silicon oxynitride layer, or a silicon nitride layer.

A back gate capping pattern 113 may be disposed on the bit lines BL. The back gate capping pattern 113 may be disposed between the bit line BL and the back gate electrode BG. The back gate capping pattern 113 may be formed of silicon oxide, silicon oxynitride, silicon nitride, a high-k dielectric material having a dielectric constant higher than that of silicon oxide, or any combination thereof.

A back gate insulating pattern 115 may be disposed on each of the back gate electrodes BG. The back gate insulating pattern 115 may be disposed between the back gate electrode BG and the etch stop layer 210. The back gate insulating pattern 115 may extend in the first direction D1 in parallel to the back gate electrodes BG. The back gate insulating pattern 115 and the back gate capping pattern 113 may be spaced apart from each other in the third direction D3 with the back gate electrode BG interposed therebetween. The back gate insulating pattern 115 may be a single layer or a multi-layer. For example, the back gate insulating pattern 115 may include silicon oxide, silicon oxynitride, or silicon nitride.

Word lines WL may be disposed on the substrate 200. The word lines WL may be spaced apart from each other in the second direction D2. The word lines WL may extend in the first direction D1 on the bit lines BL. The word lines WL may include first word lines WL1 and second word lines WL2. The first word lines WL1 and the second word lines WL2 may be alternately arranged in the second direction D2.

The first word line WL1 may be disposed at a side of each of the first active patterns AP1, and the second word line WL2 may be disposed at another side of each of the second active patterns AP2. The first and second word lines WL1 and WL2 may be vertically spaced apart from the bit lines BL and contact patterns BC. In other words, the first and second word lines WL1 and WL2 may be located between the bit lines BL and the contact patterns BC when viewed in a vertical view.

Each of the first active patterns AP1 may be disposed between the first word line WL1 and each of the back gate electrodes BG. Each of the second active patterns AP2 may be disposed between the second word line WL2 and each of the back gate electrodes BG. The first and second word lines WL1 and WL2 and the first and second active patterns AP1 and AP2 may have vertical lengths in the third direction D3, and the vertical lengths of the first and second word lines WL1 and WL2 may be less than the vertical lengths of the first and second active patterns AP1 and AP2. Unlike FIGS. 2A and 2B, the first and second word lines WL1 and WL2 may be located at a level different from that of the back gate electrode BG in a vertical direction.

For example, the first and second word lines WL1 and WL2 may include doped poly-silicon, a metal, a conductive metal nitride, a conductive metal silicide, a conductive metal oxide, or any combination thereof.

Example embodiments will be described in detail with reference to FIG. 3A. Hereinafter, the first active pattern AP1, the second active pattern AP2, the bit line BL, the first word line WL1, the second word line WL2 and the back gate electrode BG will be described. Top surfaces of the first and second active patterns AP1 and AP2 may be in contact with the contact patterns BC, and bottom surfaces of the first and second active patterns AP1 and AP2 may be in contact with the bit line BL.

Each of the first and second active patterns AP1 and AP2 may include a first dopant region SDR1 adjacent to the bit line BL, a second dopant region SDR2 adjacent to the contact pattern BC, and a channel region CHR between the first and second dopant regions SDR1 and SDR2. The channel regions CHR of the first and second active patterns AP1 and AP2 may overlap with the first and second word lines WL1 and WL2 and the back gate electrode BG in the second direction D2. The channel region CHR of the first active pattern AP1 may be disposed between the first word line WL1 and the back gate electrode BG. The channel region CHR of the second active pattern AP2 may be disposed between the second word line WL2 and the back gate electrode BG.

The first and second dopant regions SDR1 and SDR2 may be regions in the first and second active patterns AP1 and AP2, which are doped with dopants, and a dopant concentration in the first and second dopant regions SDR1 and SDR2 may be greater than a dopant concentration in the channel region CHR. When the semiconductor memory device operates, the channel regions CHR of the first and second active patterns AP1 and AP2 may be controlled by the first and second word lines WL1 and WL2 and the back gate electrode BG.

A gate insulating pattern GOX may be disposed on the bit line BL. The gate insulating pattern GOX may be disposed between each of the word lines WL and each of the active patterns AP to cover a side surface of each of the active patterns AP. The gate insulating pattern GOX may include a first gate insulating pattern 141 and a second gate insulating pattern 145.

The first gate insulating pattern 141 may be disposed on the bit line BL. The first gate insulating pattern 141 may be disposed between the first active pattern AP1 and the first word line WL1 and between the second active pattern AP2 and the second word line WL2. A top surface of the first gate insulating pattern 141 may be located at the same height as a top surface of the first word line WL1 and a top surface of the second word line WL2. The first gate insulating pattern 141 may extend to a top surface BLU of the bit line BL in parallel to the third direction D3. The first gate insulating pattern 141 may extend in the first direction D1 in parallel to the first and second word lines WL1 and WL2.

The first gate insulating pattern 141 may be disposed between the channel region CHR of the first active pattern AP1 and the first word line WL1, between the first dopant region SDR1 of the first active pattern AP1 and the first word line WL1, between the channel region CHR of the second active pattern AP2 and the second word line WL2, and between the first dopant region SDR1 of the second active pattern AP2 and the second word line WL2. The first gate insulating pattern 141 may cover one side surfaces of the channel region CHR and the first dopant region SDR1 of each of the first and second active patterns AP1 and AP2. The one side surfaces may be side surfaces adjacent to each of the first and second word lines WL1 and WL2. The first gate insulating pattern 141 may not cover a side surface of the second dopant region SDR2 of each of the first and second active patterns AP1 and AP2.

The first gate insulating pattern 141 may include a high-k dielectric material. The high-k dielectric material may be a material having a dielectric constant higher than that of silicon oxide ($SiO_2$). For example, the high-k dielectric material may include at least one of, but not limited to, aluminum oxide (AlO), tantalum oxide (TaO), titanium oxide (TiO), zirconium oxide (ZrO), or hafnium oxide (HfO).

The second gate insulating pattern 145 may be provided on the first gate insulating pattern 141. The second gate insulating pattern 145 may extend from the top surface of the first gate insulating pattern 141 onto the top surface of each of the first and second word lines WL1 and WL2 in parallel to the second direction D2. The second gate insulating pattern 145 may extend in the first direction D1 in parallel to the first and second word lines WL1 and WL2. The first gate insulating pattern 141 and the second gate insulating pattern 145 may be in contact or direct contact with each other.

The second gate insulating pattern 145 may be disposed between the first gate insulating pattern 141 and the contact patterns BC and between the first and second word lines WL1 and WL2 and the contact patterns BC. The first and second word lines WL1 and WL2 may be spaced apart from the contact patterns BC with the second gate insulating pattern 145 interposed therebetween.

The second gate insulating pattern 145 may cover one side surface of the second dopant region SDR2 of each of the first and second active patterns AP1 and AP2. The one side surface may be a side surface adjacent to each of the first and second word lines WL1 and WL2. The second gate insulating pattern 145 may not cover the side surfaces of the channel regions CHR of the first and second active patterns AP1 and AP2.

The second gate insulating pattern 145 may include a material having a dielectric constant lower than that of the first gate insulating pattern 141. The second gate insulating pattern 145 may include silicon oxide or a low-k dielectric material. The low-k dielectric material may be a material having a dielectric constant lower than that of silicon oxide ($SiO_2$). The low-k dielectric material may include at least one of, but not limited to, SiOC, air, SiOCN, SION, SiO, SiOCH, or SiOF. The first and second word lines WL1 and WL2, the first and second active patterns AP1 and AP2, the back gate electrode BG and the gate insulating pattern GOX may constitute a cell transistor.

Referring again to FIGS. 2A to 2C, a second insulating pattern 131 may be disposed between the bit lines BL and the first word lines WL1. The first word lines WL1 may be spaced apart from the bit lines BL with the second insulating pattern 131 interposed therebetween. In other words, the first word lines WL1 may not be in contact with the bit lines BL. The second insulating pattern 131 may be in contact with the bottom surfaces of the first word lines WL1. The second insulating pattern 131 may extend along the bottom surface of the first word line WL1. The second insulating pattern 131 may extend in the first direction D1 in parallel to the first word line WL1. For example, the second insulating pattern 131 may be formed of silicon oxide, silicon oxynitride, silicon nitride, or any combination thereof.

A third insulating pattern 133 may be disposed on the bit lines BL. The third insulating pattern 133 may be disposed on a top surface of the second insulating pattern 131. The third insulating pattern 133 may be disposed between the first and second word lines WL1 and WL2 adjacent to each other. The third insulating pattern 133 may cover side surfaces of the first and second word lines WL1 and WL2. The first and second word lines WL1 and WL2 may be separated from each other by the third insulating pattern 133. The third insulating pattern 133 may extend in the first direction D1 between the first and second word lines WL1 and WL2. For example, the third insulating pattern 133 may include silicon oxide.

The contact patterns BC may penetrate an interlayer insulating layer 220 and the etch stop layer 210 so as to be connected to the first and second active patterns AP1 and AP2, respectively. In other words, the contact patterns BC may be connected to the second dopant regions SDR2 of the first and second active patterns AP1 and AP2, respectively. Each of the contact patterns BC may have a lower width greater than an upper width thereof. The contact patterns BC adjacent to each other may be separated from each other by separation insulating patterns 245. Each of the contact patterns BC may have at least one of various shapes such as a circular shape, an elliptical shape, a rectangular shape, a square shape, a lozenge shape and a hexagonal shape, when viewed in a plan view.

The contact patterns BC may be formed of, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

Landing pads LP may be disposed on the contact patterns BC. Each of the landing pads LP may have at least one of various shapes such as a circular shape, an elliptical shape, a rectangular shape, a square shape, a lozenge shape and a hexagonal shape, when viewed in a plan view.

The separation insulating patterns 245 may be disposed between the landing pads LP. The landing pads LP may be arranged in a matrix form in the first direction D1 and the second direction D2 when viewed in a plan view. Top surfaces of the landing pads LP may be substantially coplanar with top surfaces of the separation insulating patterns 245.

The landing pads LP may be formed of, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

Data storage patterns DSP may be disposed on the landing pads LP, respectively. The data storage patterns DSP may be electrically connected to the first and second active patterns AP1 and AP2, respectively. The data storage patterns DSP may be arranged in a matrix form in the first direction D1 and the second direction D2. Each of the data storage patterns DSP may completely or partially overlap with each of the landing pads LP. Each of the data storage patterns DSP may be in contact with the whole or a portion of a top surface of each of the landing pads LP.

In some example embodiments, each of the data storage patterns DSP may be a capacitor and may include lower and upper electrodes and a capacitor dielectric layer disposed therebetween. Alternatively, each of the data storage patterns DSP may be a variable resistance pattern switchable between two resistance states by an electrical pulse applied thereto. For example, the data storage patterns DSP may include at least one of a phase-change material of which a crystal state is changeable depending on the amount of a current, a perovskite compound, a transition metal oxide, a magnetic material, a ferromagnetic material, or an antiferromagnetic material.

Semiconductor memory devices according to the example embodiments of the inventive concepts may include the first gate insulating pattern 141 which includes the high-k dielectric material and is provided between the channel regions CHR of the active patterns AP and the word lines WL. The high-k dielectric material between the channel regions CHR and the word lines WL may allow the channel regions CHR to be well controlled by the word lines WL when the semiconductor memory device operates. In addition, the side surfaces of the second dopant regions SDR2 adjacent to the contact patterns BC may be covered with the second gate insulating pattern 145, not the first gate insulating pattern 141 including the high-k dielectric material, and thus it is possible to minimize, prevent, or reduce in likelihood a leakage current (e.g., a gate induced drain leakage) caused by the word lines WL. As a result, the semiconductor memory device with improved electrical characteristics and reliability may be provided.

Figure 3B:
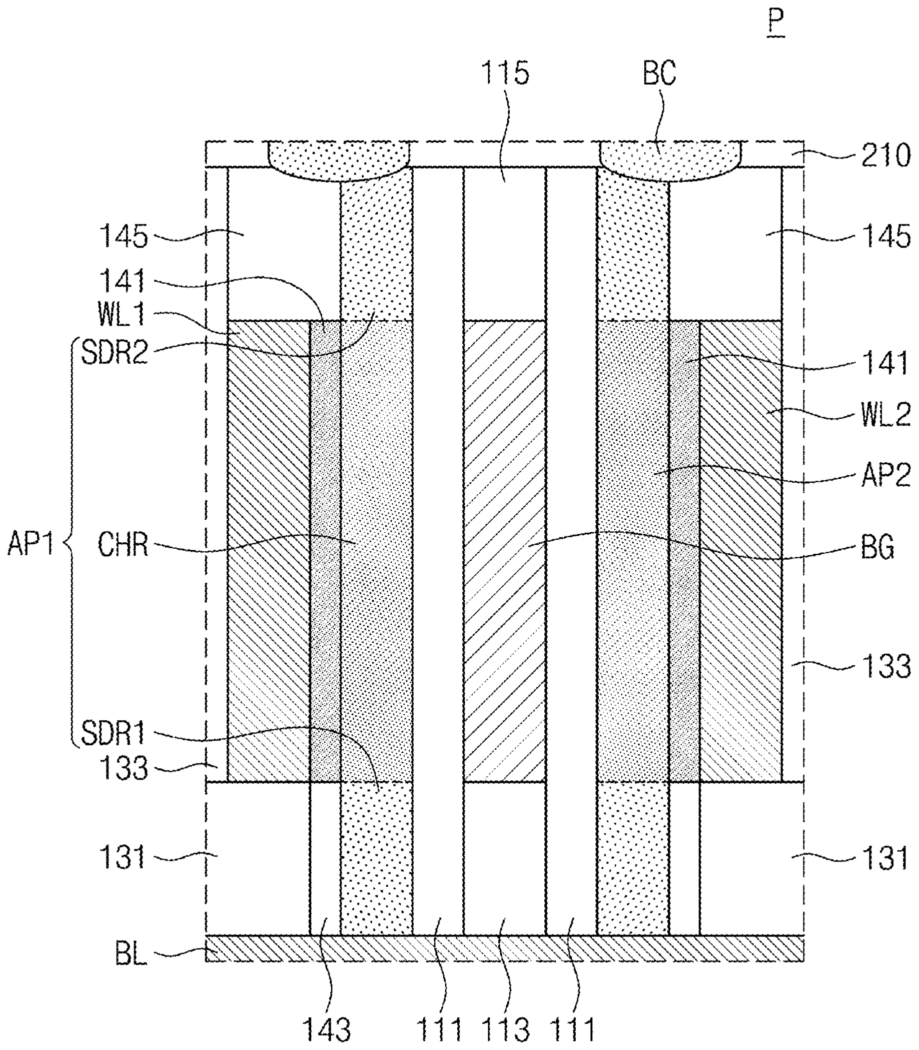
FIGS. 3B to 3D are enlarged views corresponding to the portion 'P' of FIG. 2A to illustrate portions of semiconductor memory devices according to some example embodiments of the inventive concepts.

FIG. 3B is an enlarged view corresponding to the portion 'P' of FIG. 2A to illustrate a portion of a semiconductor memory device according to some example embodiments of the inventive concepts. Hereinafter, differences between the present example embodiments and the above example embodiments of FIGS. 1, 2A to 2C and 3A will be mainly described for the purpose of ease and convenience in explanation.

Referring to FIG. 3B, a third gate insulating pattern 143 may be disposed between the bit line BL and the first gate insulating pattern 141. The third gate insulating pattern 143 may be disposed on the bit line BL to cover the side surfaces of the first dopant regions SDR1 of the first and second active patterns AP1 and AP2. The first gate insulating pattern 141 may cover the side surfaces of the channel regions CHR of the first and second active patterns AP1 and AP2. The third gate insulating pattern 143 may include a material having a dielectric constant lower than that of the first gate insulating pattern 141. For example, the third gate insulating pattern 143 may include silicon oxide.

The first gate insulating pattern 141 may be disposed between the first word line WL1 and the channel region CHR of the first active pattern AP1 and between the second word line WL2 and the channel region CHR of the second active pattern AP2. The first gate insulating pattern 141 may be spaced apart from the bit line BL with the third gate insulating pattern 143 interposed therebetween.

Figure 3C:
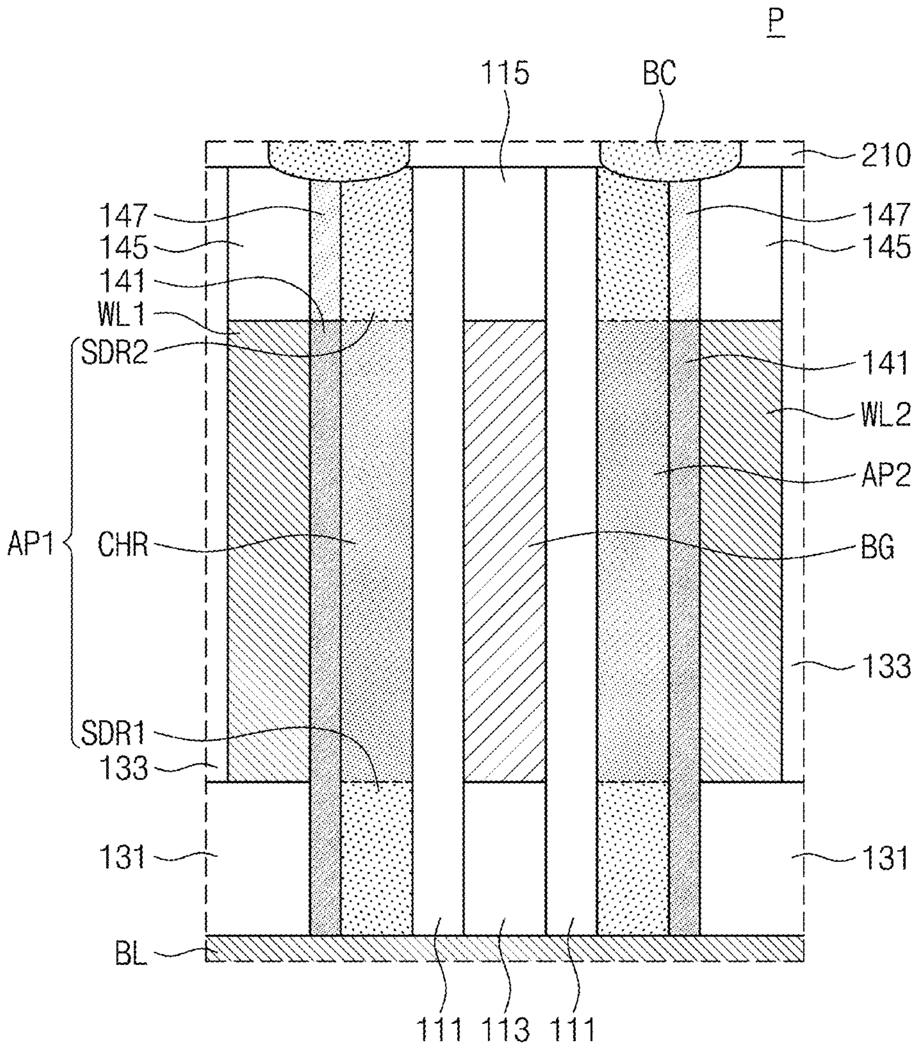

FIG. 3C is an enlarged view corresponding to the portion 'P' of FIG. 2A to illustrate a portion of a semiconductor memory device according to some example embodiments of the inventive concepts. Hereinafter, differences between the present example embodiments and the above example embodiments of FIGS. 1, 2A to 2C and 3A will be mainly described for the purpose of ease and convenience in explanation.

Referring to FIG. 3C, the second gate insulating pattern 145 may include a second sub-gate insulating pattern 147. The second sub-gate insulating pattern 147 may be provided on the first gate insulating pattern 141. The second sub-gate insulating pattern 147 may not be in contact with the first and second word lines WL1 and WL2. The second sub-gate insulating pattern 147 may cover the side surfaces of the first and second active patterns AP1 and AP2. The second sub-gate insulating pattern 147 may be disposed between the first gate insulating pattern 141 and the contact patterns BC. The second sub-gate insulating pattern 147 may include a material having a dielectric constant lower than that of the first gate insulating pattern 141. The second sub-gate insulating pattern 147 may include a low-k dielectric material. The low-k dielectric material may include at least one of, but not limited to, SiOC, air, SiOCN, SiON, SiO, SiOCH, or SiOF. The second sub-gate insulating pattern 147 may include a material different from that of the second gate insulating pattern 145.

Figure 3D:
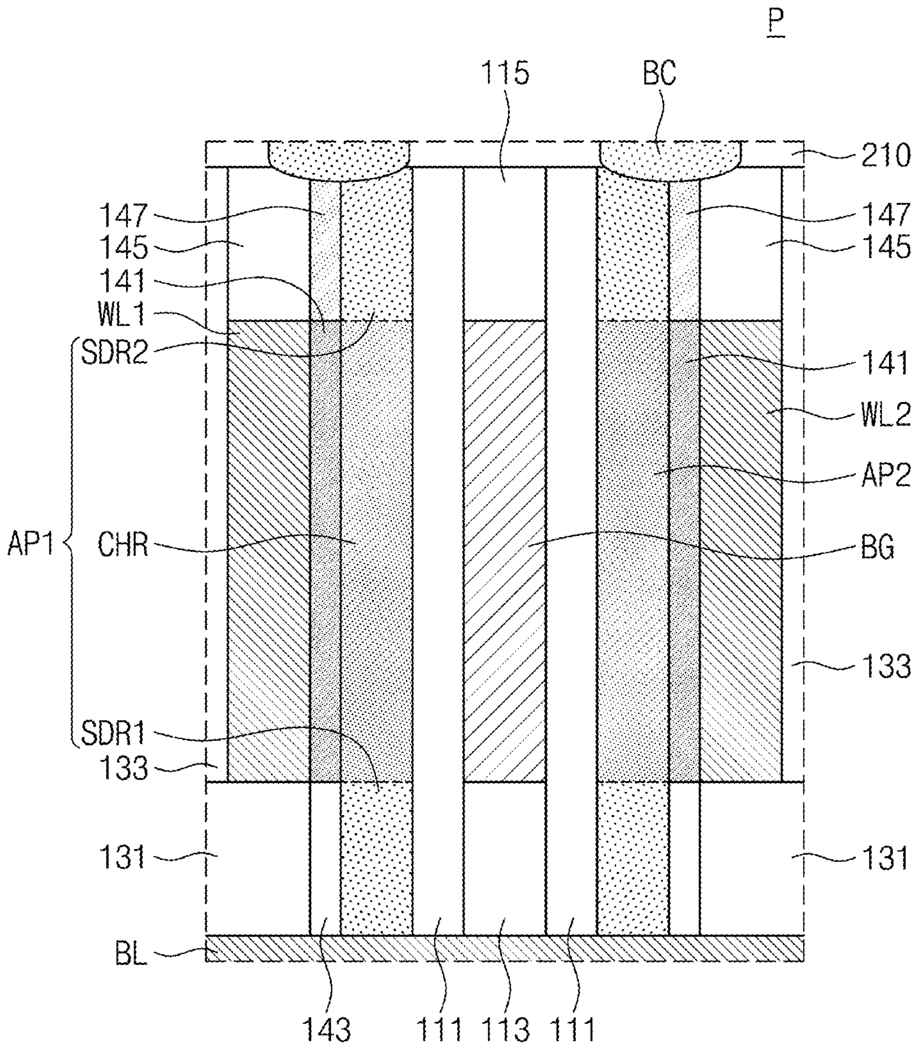

FIG. 3D is an enlarged view corresponding to the portion 'P' of FIG. 2A to illustrate a portion of a semiconductor memory device according to some example embodiments of the inventive concepts. Hereinafter, differences between the present example embodiments and the above example embodiments of FIGS. 1, 2A to 2C and 3A will be mainly described for the purpose of ease and convenience in explanation.

Referring to FIG. 3D, the second gate insulating pattern 145 may include the second sub-gate insulating pattern 147. The second sub-gate insulating pattern 147 may be provided on the first gate insulating pattern 141. The second sub-gate insulating pattern 147 may not be in contact with the first and second word lines WL1 and WL2. The second sub-gate insulating pattern 147 may cover the side surfaces of the first and second active patterns AP1 and AP2. The second sub-gate insulating pattern 147 may be disposed between the first gate insulating pattern 141 and the contact patterns BC. The second sub-gate insulating pattern 147 may include a material having a dielectric constant lower than that of the first gate insulating pattern 141. The second sub-gate insulating pattern 147 may include a low-k dielectric material. The low-k dielectric material may include at least one of, but not limited to, SiOC, air, SiOCN, SiON, SiO, SiOCH, or SiOF. The second sub-gate insulating pattern 147 may include a material different from that of the second gate insulating pattern 145.

The third gate insulating pattern 143 may be disposed between the bit line BL and the first gate insulating pattern 141. The third gate insulating pattern 143 may be disposed on the bit line BL to cover the side surfaces of the first dopant regions SDR1 of the first and second active patterns AP1 and AP2. The first gate insulating pattern 141 may cover the side surfaces of the channel regions CHR of the first and second active patterns AP1 and AP2. The third gate insulating pattern 143 may include a material having a dielectric constant lower than that of the first gate insulating pattern 141. For example, the third gate insulating pattern 143 may include silicon oxide.

The first gate insulating pattern 141 may be disposed between the first word line WL1 and the channel region CHR of the first active pattern AP1 and between the second word line WL2 and the channel region CHR of the second active pattern AP2. The first gate insulating pattern 141 may be spaced apart from the bit line BL with the third gate insulating pattern 143 interposed therebetween.

FIGS. 4A to 4L are cross-sectional views corresponding to the line A-A' of FIG. 1 to illustrate a method of manufacturing a semiconductor memory device according to some example embodiments of the inventive concepts. Hereinafter, the descriptions to the same features as mentioned with reference to FIGS. 1 to 3A will be omitted for the purpose of ease and convenience in explanation.

Figure 4A:
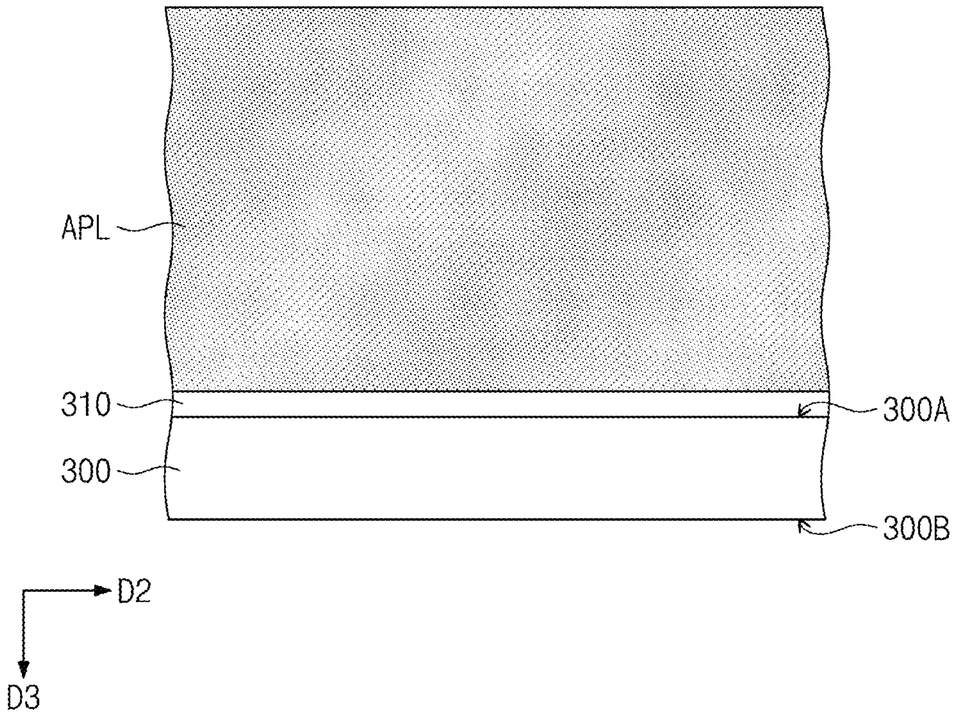
FIGS. 4A to 4L are cross-sectional views corresponding to the line A-A' of FIG. 1 to illustrate a method of manufacturing a semiconductor memory device according to some example embodiments of the inventive concepts.

Referring to FIG. 4A, a stack structure in which a first substrate 300, an insulating layer 310 and an active layer APL are stacked may be prepared.

The insulating layer 310 and the active layer APL may be provided on the first substrate 300. The first substrate 300 may have a first surface 300A and a second surface 300B which are opposite to each other, and the first surface 300A of the first substrate 300 may be in contact with the insulating layer 310. The stack structure may be a silicon-on-insulator (SOI) substrate. For example, the first substrate 300 may be a silicon substrate, a germanium substrate, and/or a silicon-germanium substrate.

The insulating layer 310 may be a buried oxide (BOX) layer formed by a separation by implanted oxygen (SIMOX) method or a bonding and layer transfer method. Alternatively, the insulating layer 310 may be an insulating layer formed by a chemical vapor deposition (CVD) method. For example, the insulating layer 310 may include a silicon oxide layer, a silicon nitride layer, a silicon oxynitride layer, and/or a low-k dielectric layer.

The active layer APL may be a single-crystalline semiconductor layer. For example, the active layer APL may be a single-crystalline silicon substrate, a single-crystalline germanium substrate, and/or a single-crystalline silicon-germanium substrate. The active layer APL may have a first surface and a second surface which are opposite to each other, and the second surface of the active layer APL may be in contact with the insulating layer 310.

Figure 4B:
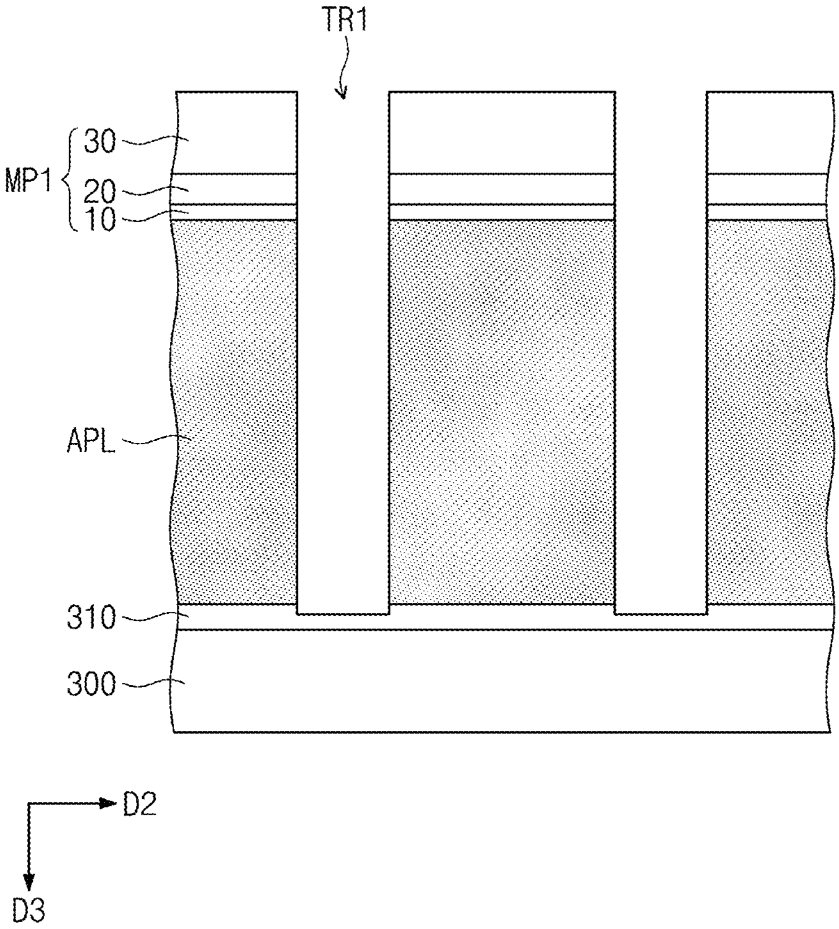

Referring to FIG. 4B, a first mask pattern MP1 may be formed on the active layer APL. The first mask pattern MP1 may include a buffer layer 10, a first mask layer 20 and a second mask layer 30, which are sequentially stacked. The first mask layer 20 may be formed of a material having an etch selectivity with respect to the buffer layer 10 and the second mask layer 30. For example, the buffer layer 10 and the second mask layer 30 may include silicon oxide, and the first mask layer 20 may include silicon nitride.

Next, the active layer APL may be anisotropically etched using the first mask pattern MP1 as an etch mask. Thus, first trenches TR1 extending in the first direction D1 may be formed in the active layer APL. The first trenches TR1 may expose the insulating layer 310 and may be spaced apart from each other in the second direction D2 by a certain distance.

Figure 4C:
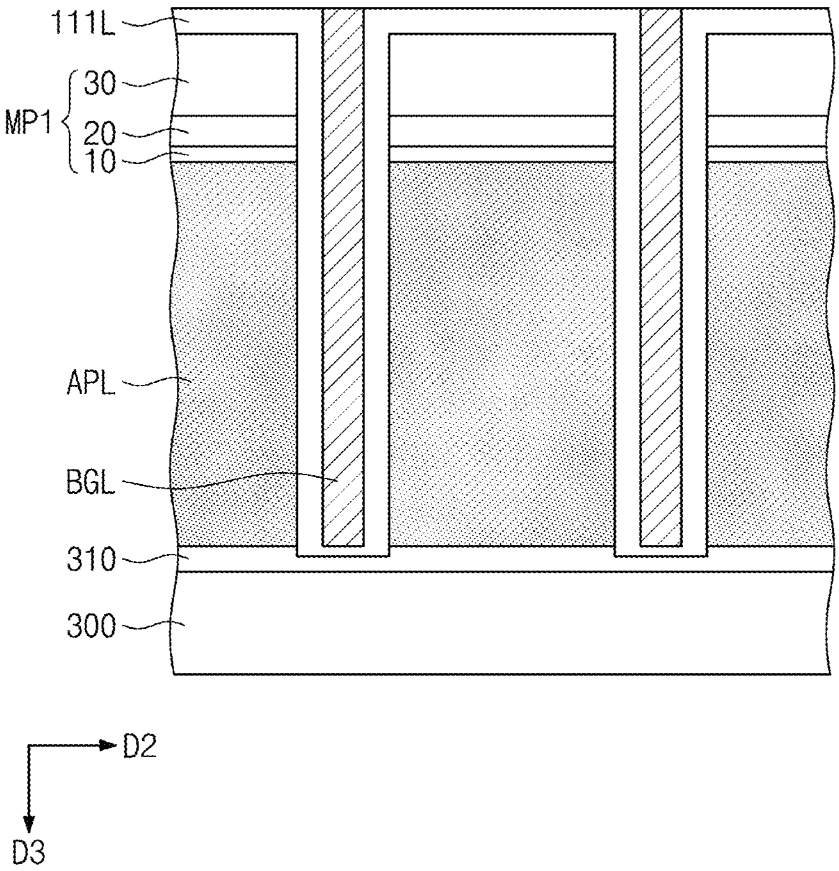

Referring to FIG. 4C, a first insulating layer 111L may be formed on the first mask pattern MP1 and in the first trenches TR1. The first insulating layer 111L may conformally cover a top surface of the first mask pattern MP1 and inner surfaces of the first trenches TR1. The first insulating layer 111L may fill a portion of each of the first trenches TR1.

After the formation of the first insulating layer 111L, a back gate electrode layer BGL may be formed in a remaining portion of each of the first trenches TR1. For example, a back gate electrode layer may be deposited on the first insulating layer 111L to fill the remaining portions of the first trenches TR1, and then, the deposited back gate electrode layer may be isotropically etched to form the back gate electrode layer BGL. Thus, an upper portion of the first insulating layer 111L may be exposed.

Figure 4D:
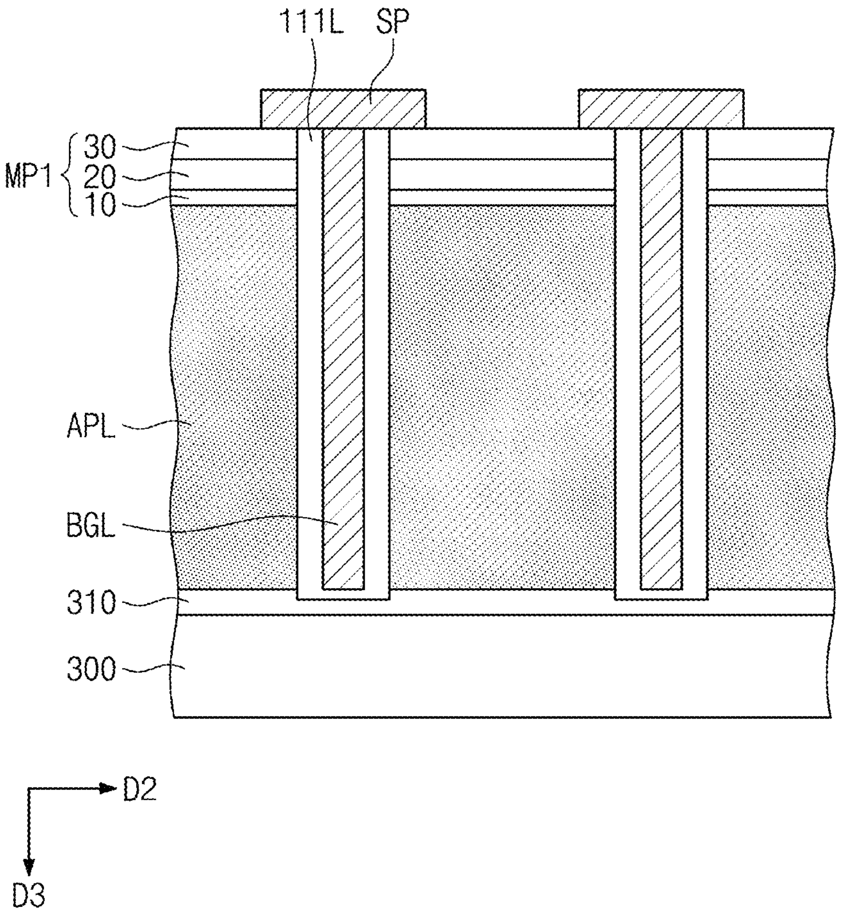

Referring to FIG. 4D, a portion of the first insulating layer 111L may be etched. The portion of the first insulating layer 111L covering the top surface of the first mask pattern MP1 may be isotropically etched to expose the top surface of the first mask pattern MP1.

Spacers SP may be formed on the first insulating layer 111L and the back gate electrode layer BGL. The spacers SP may include the same material as the back gate electrode layer BGL. Each of the spacers SP may cover top surfaces of the first insulating layer 111L and the back gate electrode layer BGL and may extend onto the top surface of the first mask pattern MP1. Each of the spacers SP may overlap with a portion of the active layer APL when viewed in a plan view. A width of an active pattern to be formed later may be determined depending on a width of the spacer SP.

Figure 4E:
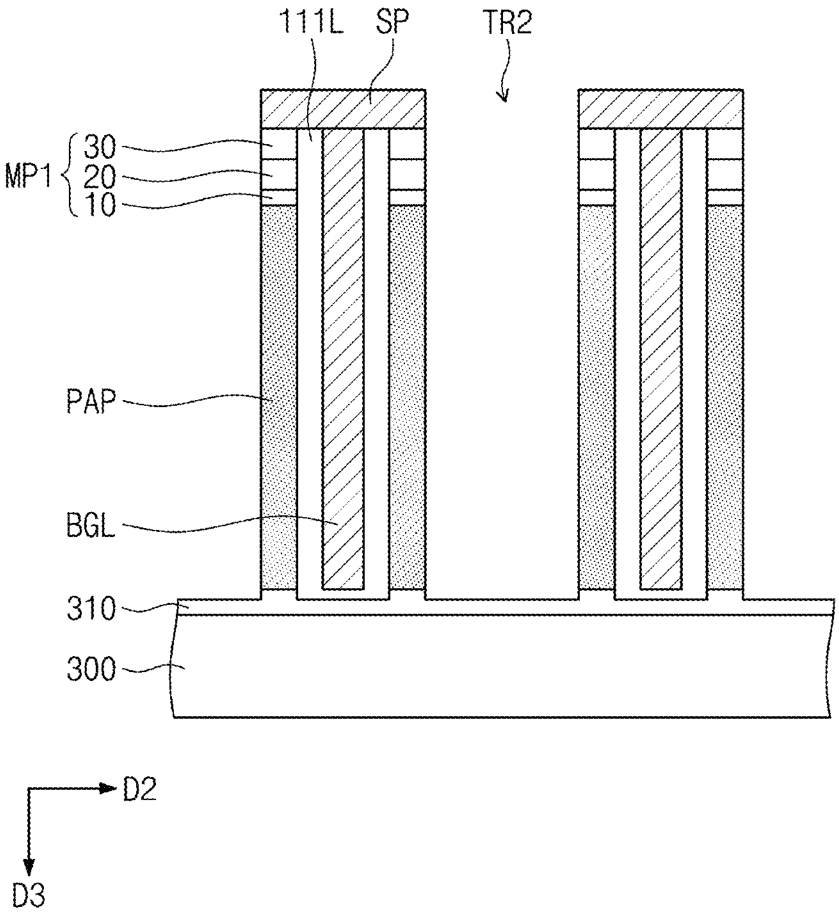

Referring to FIG. 4E, an etching process may be performed on the first mask pattern MP1 and the active layer APL to form second trenches TR2 and a preliminary active pattern PAP. The etching process may sequentially etch the first mask pattern MP1 and the active layer APL by using the spacers SP as etch masks. Each of the second trenches TR2 may expose a portion of the insulating layer 310 and a side surface of the preliminary active pattern PAP.

Figure 4F:
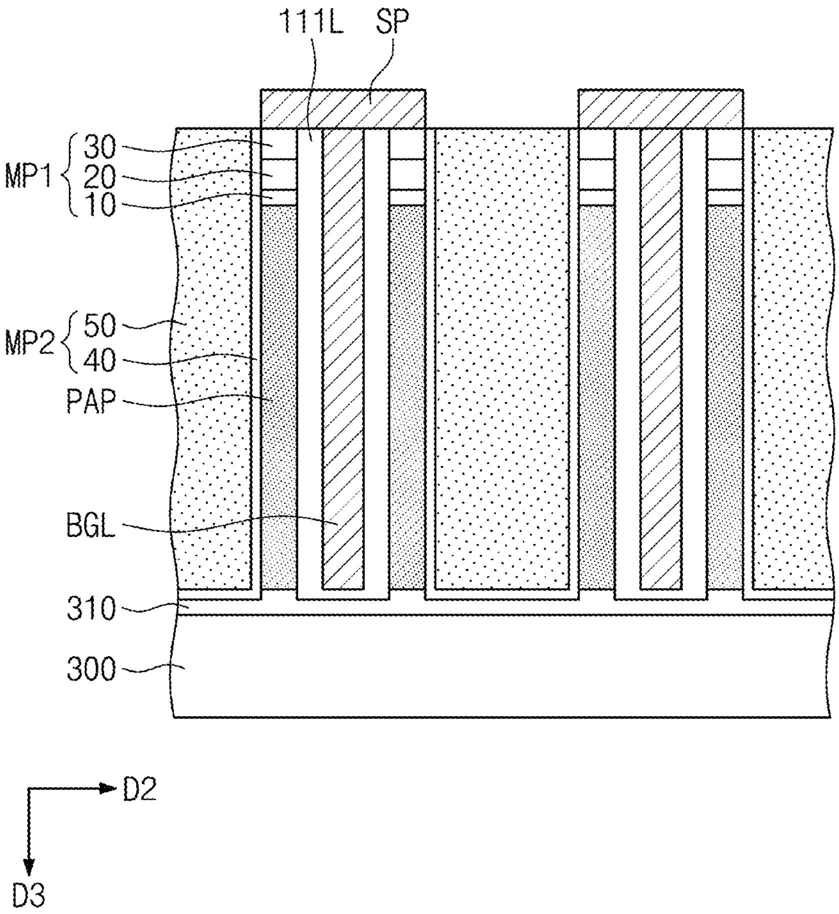

Referring to FIG. 4F, a second mask pattern MP2 may be formed in each of the second trenches TR2. The second mask pattern MP2 may include a third mask layer 40 conformally formed in the second trenches TR2, and a fourth mask layer 50 filling each of the second trenches TR2. The second mask pattern MP2 may be formed of a material having an etch selectivity with respect to the spacers SP and the first insulating layer 111L. For example, the third mask layer 40 may include silicon oxide. For example, the fourth mask layer 50 may include a carbon polymer. The second mask pattern MP2 may have a line shape extending in the first direction D1.

Figure 4G:
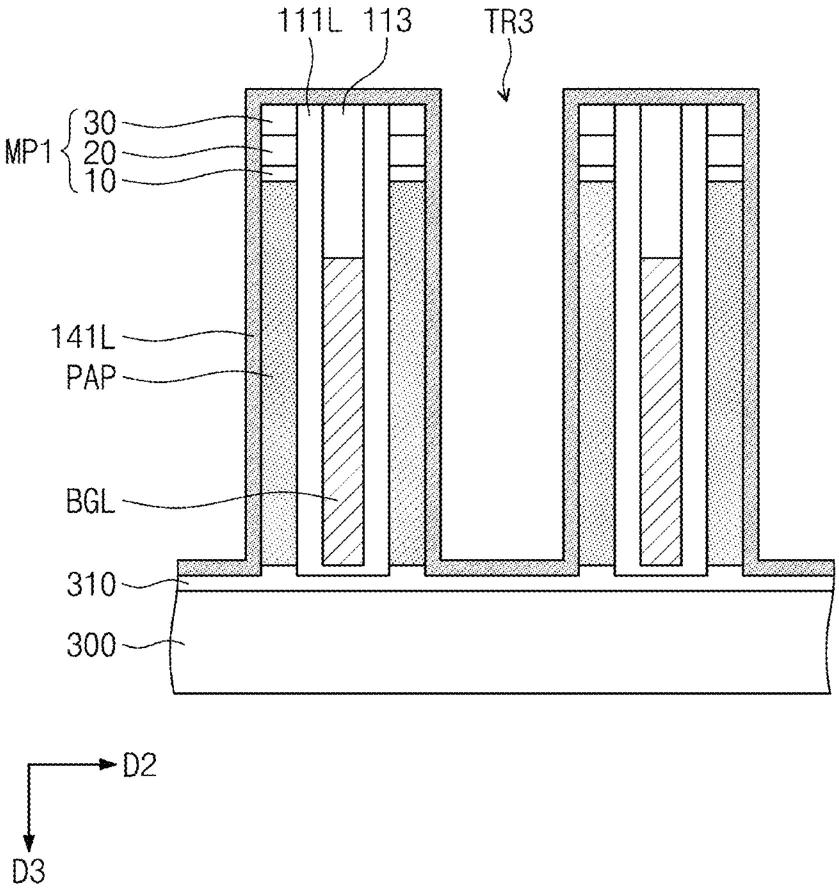

Referring to FIG. 4G, an etching process may be performed on the second mask pattern MP2 and the spacers SP. A portion of the back gate electrode layer BGL may be removed by the etching process. After the etching process, a back gate capping pattern 113 may be formed on a remaining portion of the back gate electrode layer BGL. A top surface of the back gate capping pattern 113 may be coplanar with a top surface of the second mask layer 30 and the top surface of the first insulating layer 111L.

Next, a first gate insulating layer 141L may be formed on the insulating layer 310. The first gate insulating layer 141L may cover the top surfaces of the first mask pattern MP1, the first insulating layer 111L and the back gate capping pattern 113. The first gate insulating layer 141L may cover the side surface of the preliminary active pattern PAP. Thus, a third trench TR3 may be formed.

Figure 4H:
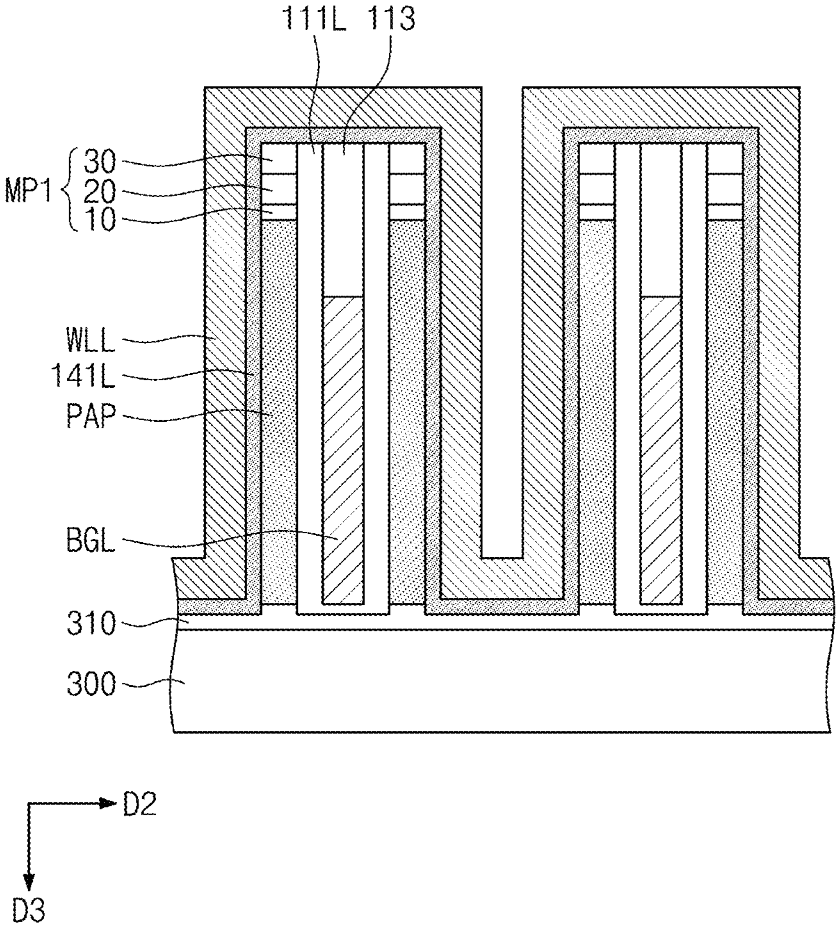

Referring to FIG. 4H, a word line layer WLL may be formed on the first gate insulating layer 141L. The word line layer WLL may cover a top surface of the first gate insulating layer 141L. The word line layer WLL may fill a portion of the third trench TR3.

Figure 4I:
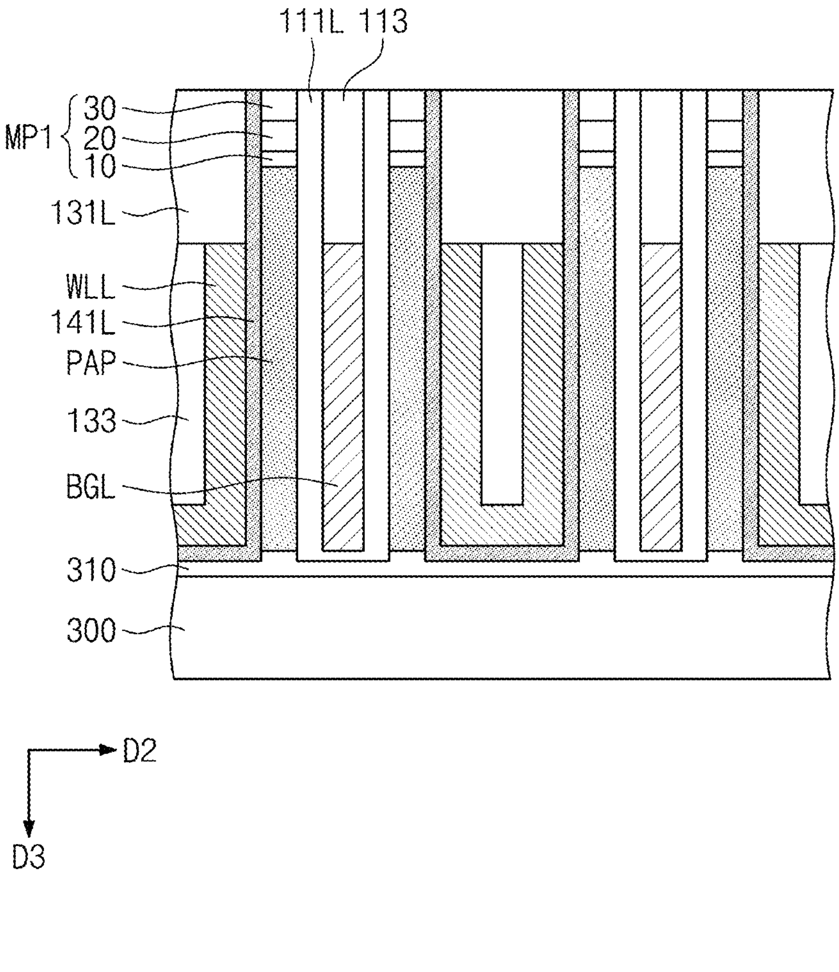

Referring to FIG. 4I, a third insulating pattern 133 may be formed on the word line layer WLL. The third insulating pattern 133 may fill a portion of the third trench TR3. A third insulating layer may be deposited on the word line layer WLL and then may be etched to form the third insulating pattern 133. The third insulating pattern 133 may fill a portion of the third trench TR3. A top surface of the third insulating pattern 133 may be located at substantially the same height as a top surface of the back gate electrode layer BGL. Next, a portion of the word line layer WLL may be etched. The word line layer WLL may be etched until its top surface is located at substantially the same height as the top surface of the back gate electrode layer BGL.

A second insulating layer 131L may be formed in a remaining portion of the third trench TR3. The second insulating layer 131L may cover the top surface of the word line layer WLL, the top surface of the third insulating pattern 133, and an inner side surface of the first gate insulating layer 141L. A top surface of the second insulating layer 131L may be substantially coplanar with the top surfaces of the first gate insulating layer 141L, the first mask pattern MP1, the first insulating layer 111L and the back gate capping pattern 113.

Figure 4J:
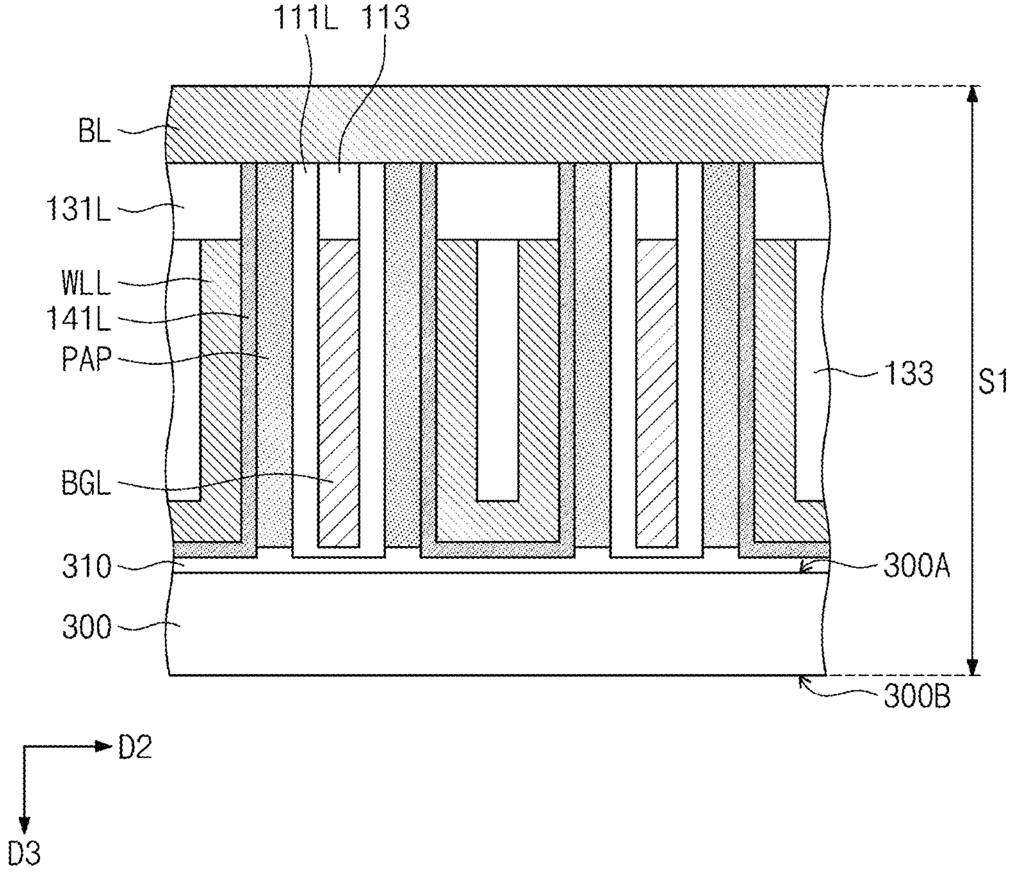

Referring to FIG. 4J, the first mask pattern MP1 may be removed. An etching process may be performed on the first mask pattern MP1 to etch the first mask pattern MP1, a portion of the first insulating layer 111L, a portion of the back gate capping pattern 113, a portion of the first gate insulating layer 141L, and a portion of the second insulating layer 131L. Thus, a top surface of the preliminary active pattern PAP may be exposed.

Next, bit lines BL may be formed on the preliminary active pattern PAP. Each of the bit lines BL may have a line shape extending in the second direction D2. The bit lines BL may be in contact with the top surfaces of the preliminary active pattern PAP, the first gate insulating layer 141L, the first insulating layer 111L, the back gate capping pattern 113, and the second insulating layer 131L. Since the bit lines BL are formed, a first structure S1 may be manufactured.

Figure 4K:
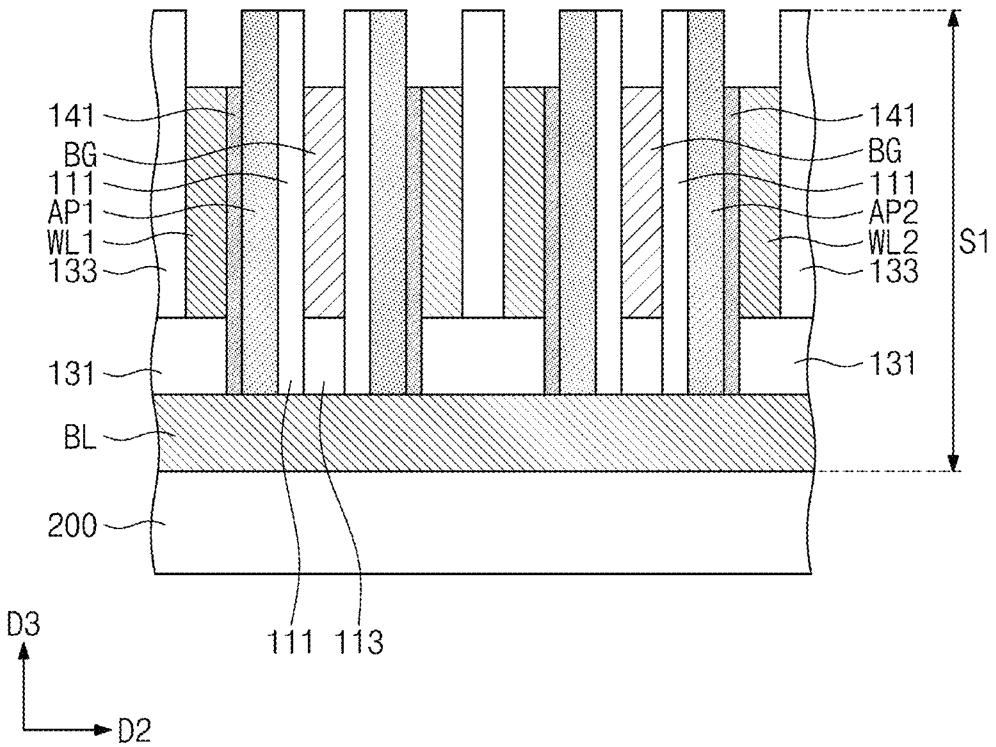

Referring to FIG. 4K, a substrate 200 may be bonded to top surfaces of the bit lines BL, and then, a flip process of overturning the first structure S1 may be performed. The first structure S1 may be overturned in such a way that the second surface 300B of the first substrate 300 faces the third direction D3. Subsequently, a backside lapping process of removing the first substrate 300 may be performed. The removal of the first substrate 300 may include performing a grinding process to expose the insulating layer 310. An etching process may be performed on the exposed insulating layer 310 to remove the insulating layer 310 and a portion of the first insulating layer 111L. Thus, the back gate electrode layer BGL and the first gate insulating layer 141L may be exposed.

A wet etching process may be performed on the first gate insulating layer 141L to form a first gate insulating pattern 141. A portion of the word line layer WLL may be exposed by the wet etching process. An etching process may be performed on the exposed back gate electrode layer BGL and the exposed word line layer WLL to form back gate electrodes BG and first and second word lines WL1 and WL2. At this time, top surfaces of the back gate electrodes BG, the first and second word lines WL1 and WL2 and the first gate insulating pattern 141 may be located at the same height. The preliminary active pattern PAP between the first word line WL1 and the back gate electrode BG may be a first active pattern AP1, and the preliminary active pattern PAP between the second word line WL2 and the back gate electrode BG may be a second active pattern AP2.

Figure 4L:
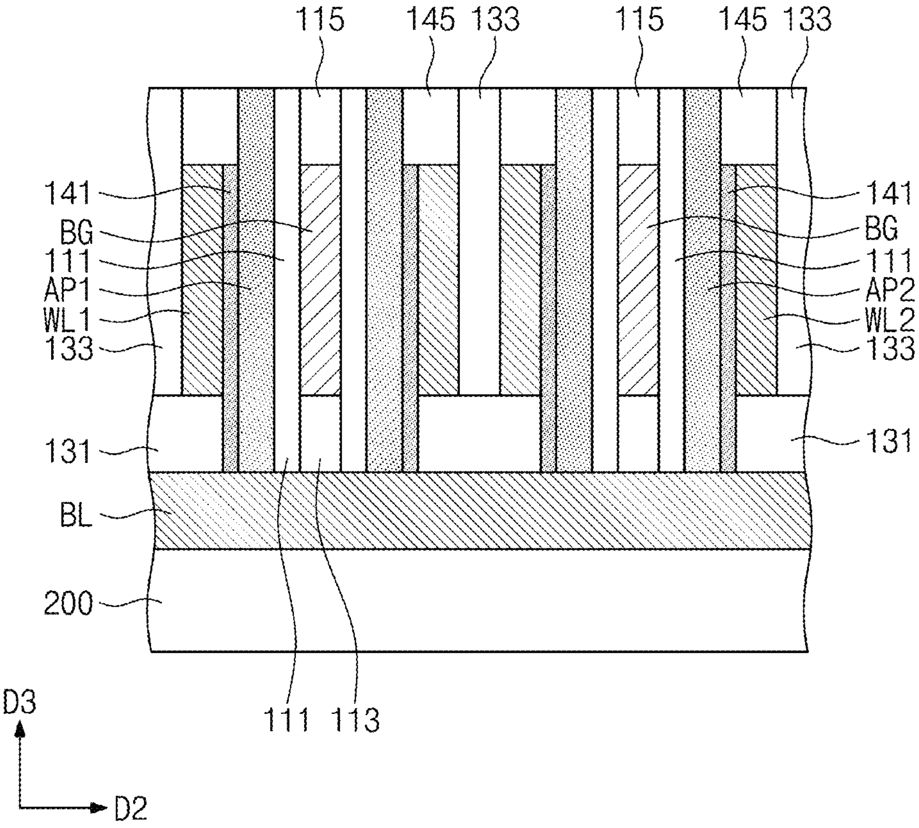

Referring to FIG. 4L, a second gate insulating pattern 145 may be formed on the first and second word lines WL1 and WL2 and the first gate insulating pattern 141. The formation of the second gate insulating pattern 145 may include depositing a second gate insulating layer, and performing a planarization process on the deposited second gate insulating layer. A back gate insulating pattern 115 may be formed on the back gate electrodes BG. The formation of the back gate insulating pattern 115 may include depositing a back gate insulating layer, and performing a planarization process on the deposited back gate insulating layer. For example, the second gate insulating pattern 145 and the back gate insulating pattern 115 may be formed by a single process.

Referring again to FIG. 2A, an etch stop layer 210 and an interlayer insulating layer 220 may be formed on the first and second active patterns AP1 and AP2. Thereafter, the interlayer insulating layer 220 and the etch stop layer 210 may be patterned to expose the first and second active patterns AP1 and AP2, and then, contact patterns BC may be formed. Landing pads LP may be formed on the contact patterns BC, and then, the interlayer insulating layer 220 and the etch stop layer 210 may be etched, and then, separation insulating patterns 245 may be formed. Data storage patterns DSP may be formed on the landing pads LP, thereby manufacturing a semiconductor memory device.

FIGS. 5A to 5D are cross-sectional views illustrating semiconductor memory devices according to some example embodiments of the inventive concepts. Hereinafter, the descriptions to the same features as mentioned with reference to FIGS. 1 to 3A will be omitted for the purpose of ease and convenience in explanation.

Figure 5A:
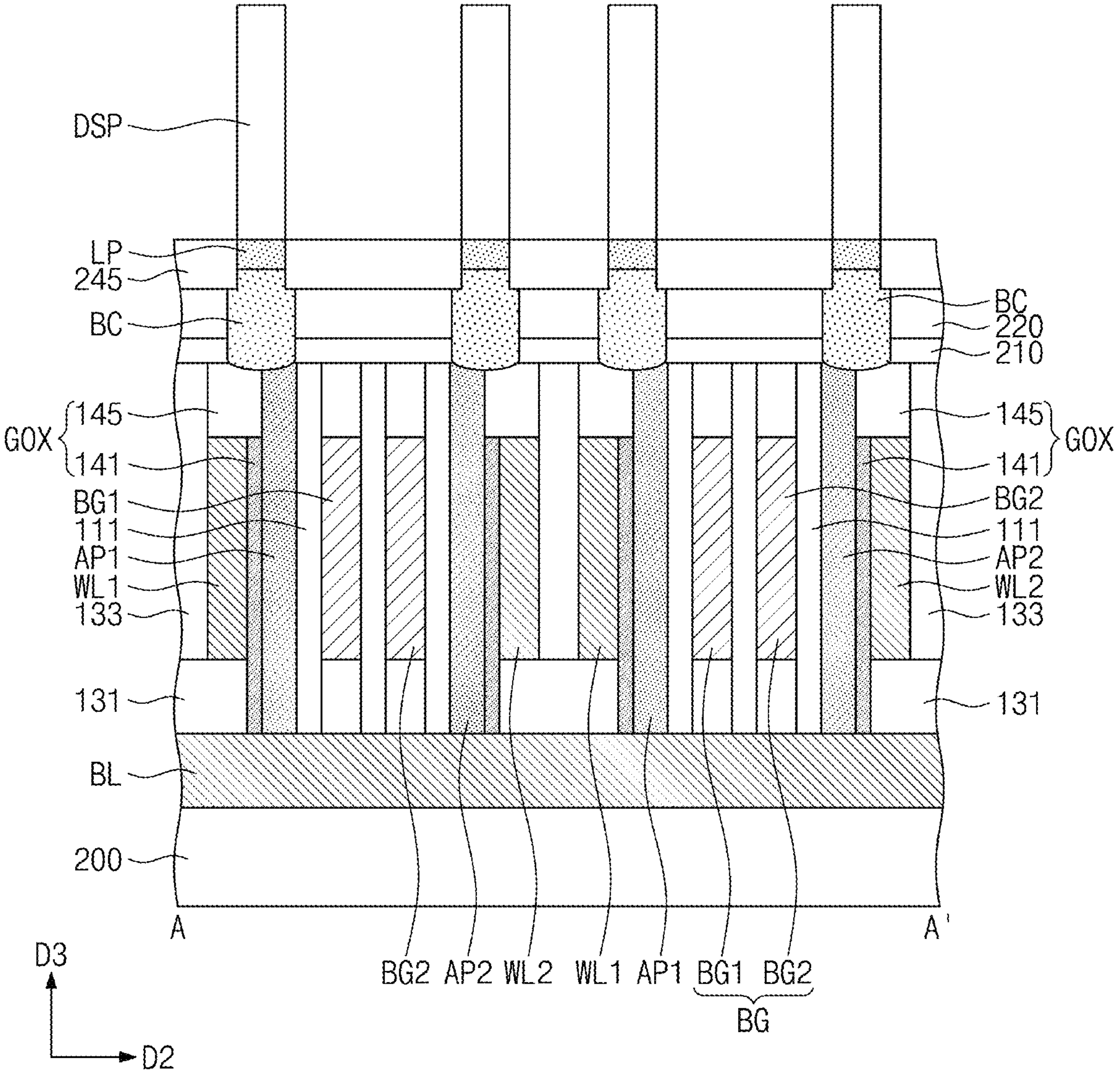
FIGS. 5A to 5D are cross-sectional views illustrating semiconductor memory devices according to some example embodiments of the inventive concepts.

Referring to FIG. 5A, each of back gate electrodes BG may include a first back gate electrode BG1 and a second back gate electrode BG2. The first back gate electrode BG1 may be spaced apart from the second back gate electrode BG2 in the second direction D2. The first insulating pattern 111 may be disposed between the first back gate electrode BG1 and the second back gate electrode BG2. The first back gate electrode BG1 may be adjacent to the first active pattern AP1.

The channel regions CHR of the first active patterns AP1 may be controlled by the first word lines WL1 and the first back gate electrodes BG1 when the semiconductor memory device operates. The channel regions CHR of the second active patterns AP2 may be controlled by the second word lines WL2 and the second back gate electrodes BG2 when the semiconductor memory device operates. The first back gate electrode BG1 and the second back gate electrode BG2 may be controlled independently of each other.

Figure 5B:
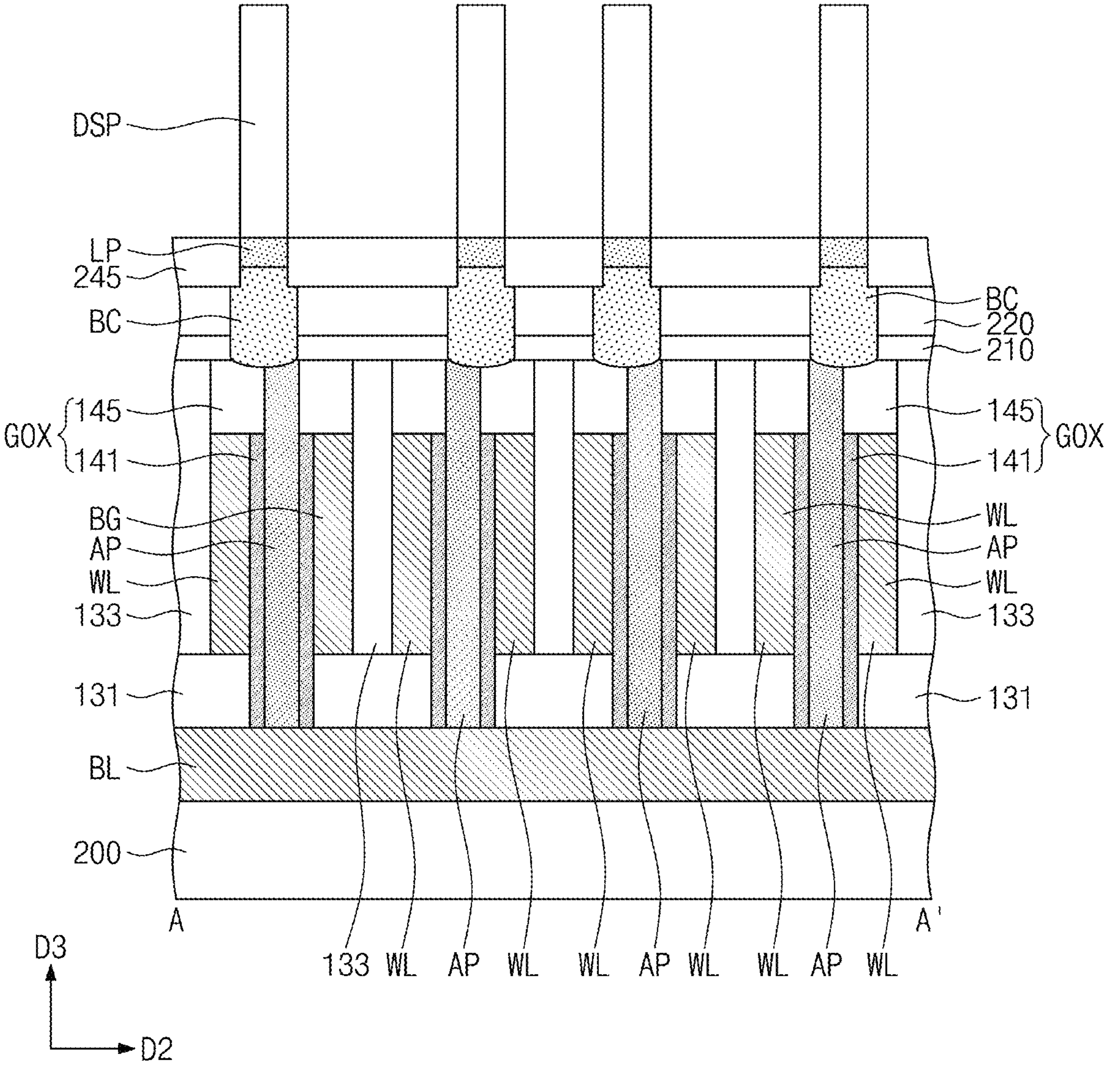

Referring to FIG. 5B, a semiconductor memory device according to some example embodiments of the inventive concepts may not include the back gate electrodes BG. Each of active patterns AP may be disposed between a pair of word lines WL. The first gate insulating pattern 141 may be disposed between each of the active patterns AP and each of the word lines WL. The channel region CHR of each of the active patterns AP may be controlled by the pair of word lines WL adjacent to each other when the semiconductor memory device operates.

Figure 5C:
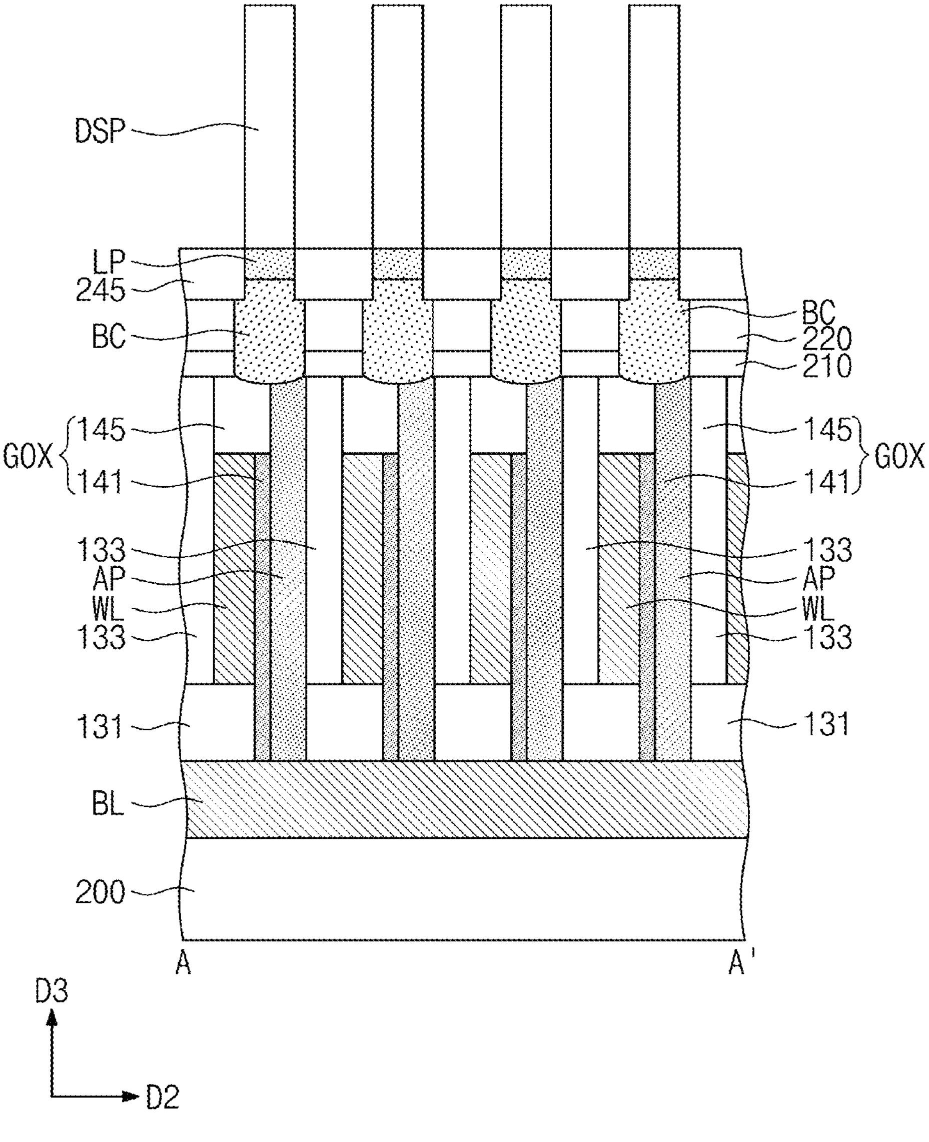

Referring to FIG. 5C, a semiconductor memory device may not include the back gate electrodes BG. The active patterns AP and the word lines WL may be alternately arranged. Each of the active patterns AP may be adjacent to a corresponding one of the word lines WL, and the first gate insulating pattern 141 may be disposed between each of the active patterns AP and the corresponding word line WL. The first gate insulating pattern 141 may be disposed on one side surface of each of the active patterns AP. The third insulating pattern 133 may be disposed on another side surface of each of the active patterns AP. The channel regions CHR of the active patterns AP may be controlled by the word lines WL when the semiconductor memory device operates.

Figure 5D:
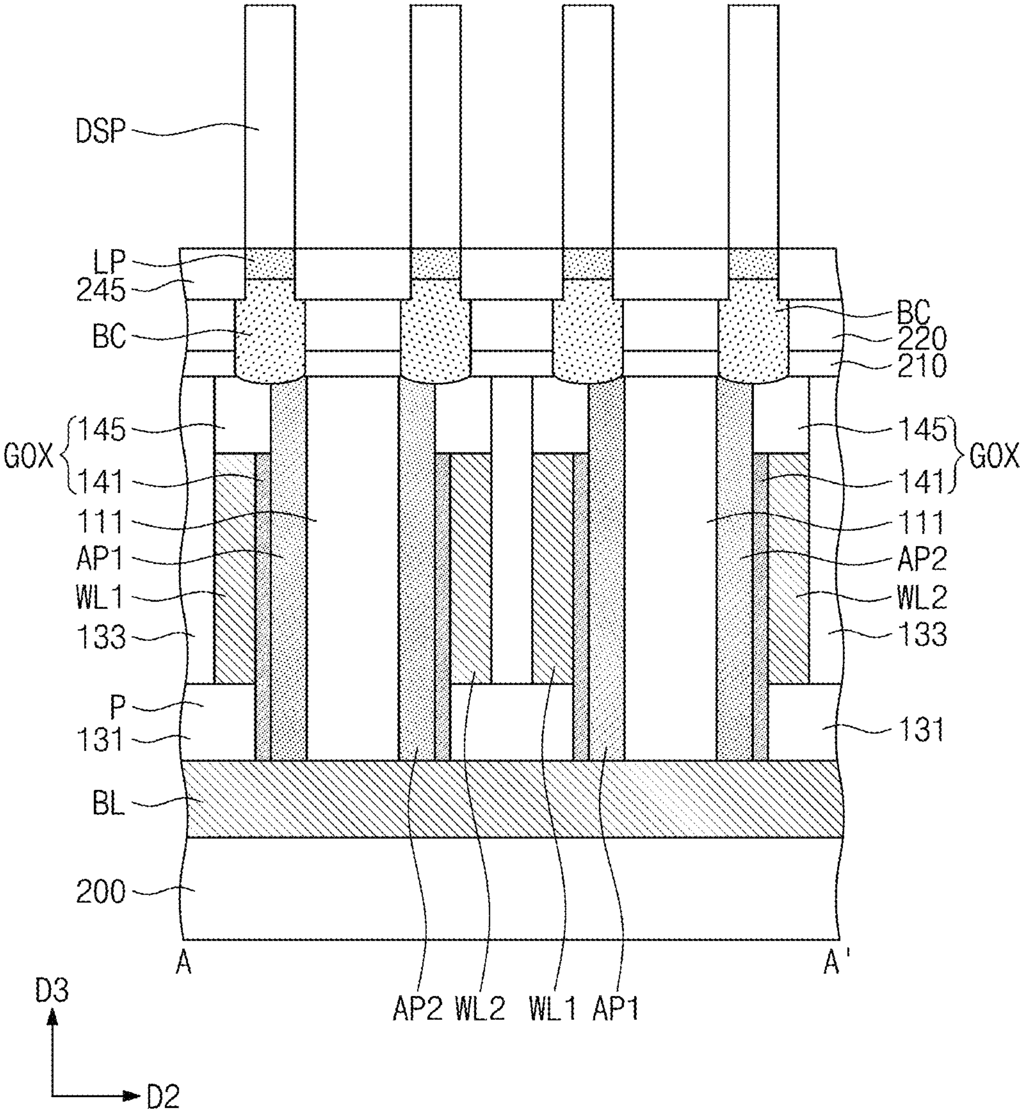

Referring to FIG. 5D, a semiconductor memory device may not include the back gate electrodes BG. The first insulating pattern 111 may be disposed between a pair of the first and second active patterns AP1 and AP2 adjacent to each other. The channel regions CHR of the first active patterns AP1 may be controlled by the first word lines WL1 when the semiconductor memory device operates. The channel regions CHR of the second active patterns AP2 may be controlled by the second word lines WL2 when the semiconductor memory device operates.

Figure 6A:
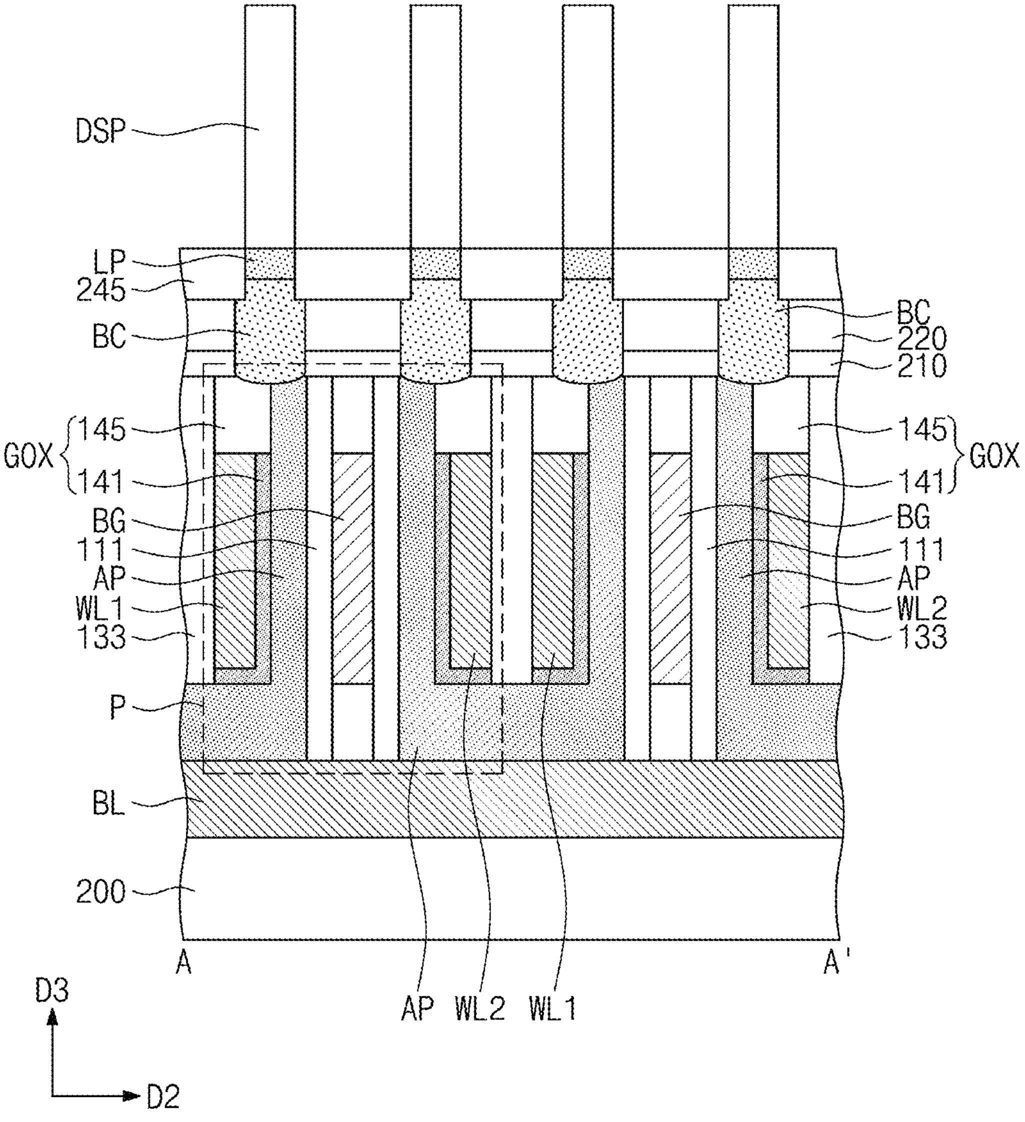
FIGS. 6A to 6D are cross-sectional views illustrating semiconductor memory devices according to some example embodiments of the inventive concepts.
Figure 6B:
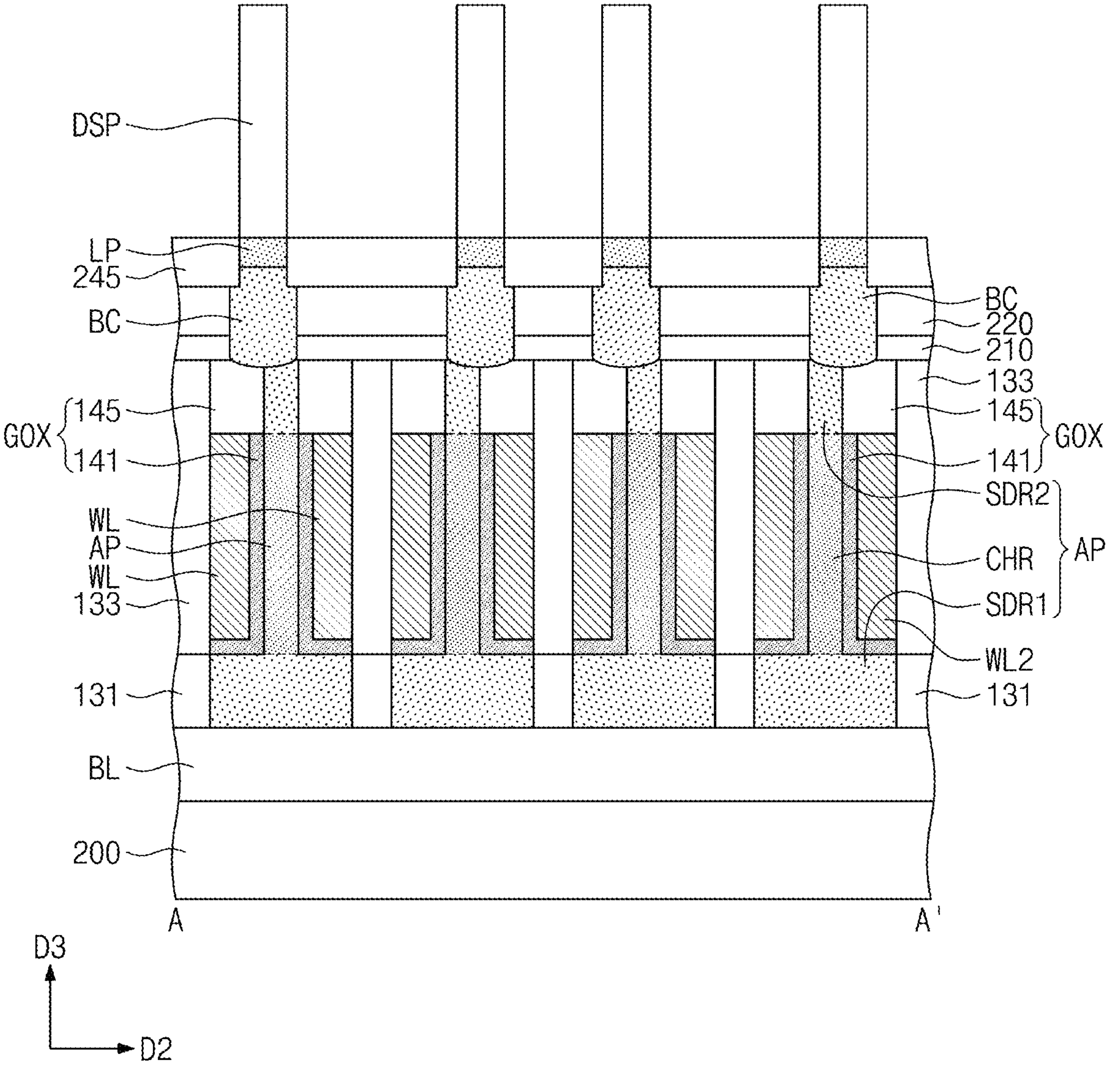
Figure 7:
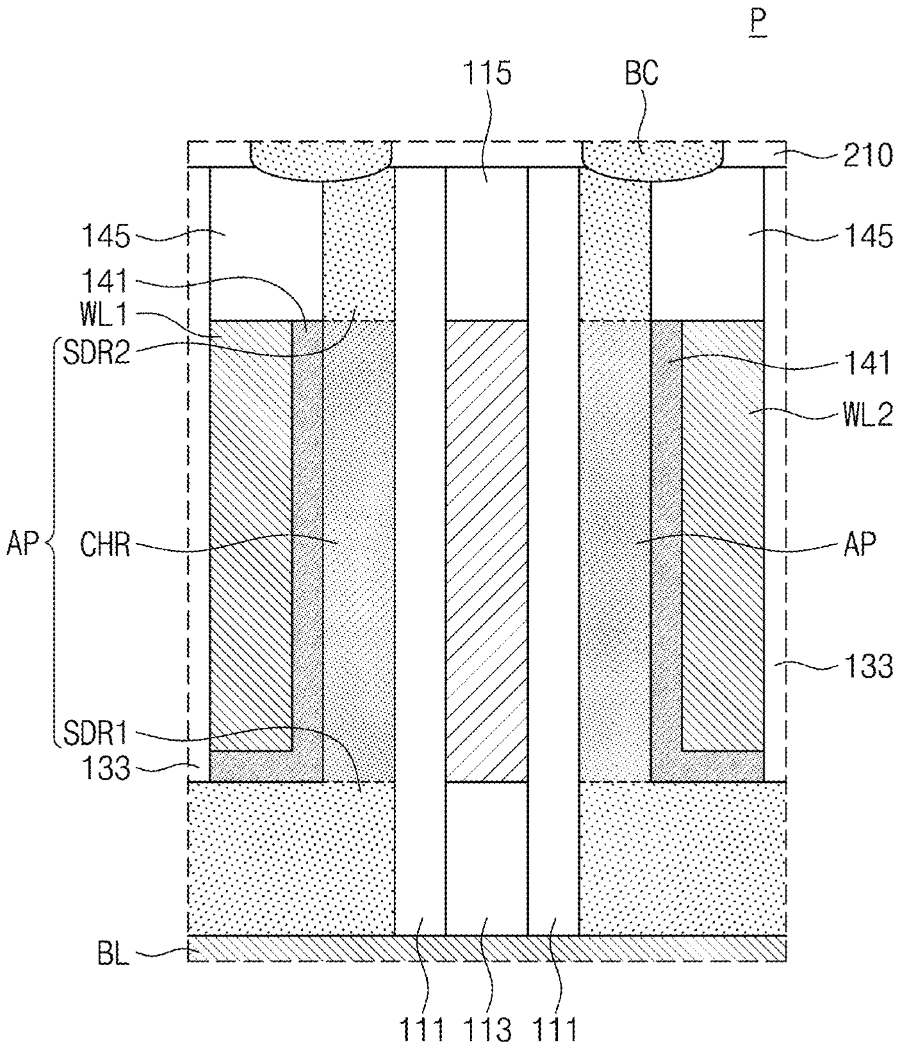
FIG. 7 is an enlarged view of a portion 'P' of FIG. 6A to illustrate a portion of a semiconductor memory device according to some example embodiments of the inventive concepts.

FIGS. 6A and 6B are cross-sectional views illustrating semiconductor memory devices according to some example embodiments of the inventive concepts. FIG. 7 is an enlarged view of a portion 'P' of FIG. 6A to illustrate a portion of a semiconductor memory device according to some example embodiments of the inventive concepts. Hereinafter, the descriptions to the same features as mentioned with reference to FIGS. 1 to 3A will be omitted for the purpose of ease and convenience in explanation.

Referring to FIGS. 6A and 7, each of active patterns AP may have a U-shape. The active patterns AP may be spaced apart from each other in the first direction D1 and the second direction D2. Hereinafter, a single active pattern AP, a single first word line WL1 and a single second word line WL2 will be mainly described for the purpose of ease and convenience in explanation.

The active pattern AP may include a first dopant region SDR1, a channel region CHR, and a second dopant region SDR2. The channel region CHR, the first word line WL1 and the second word line WL2 may be disposed on the first dopant region SDR1 of the active pattern AP. The first and second word lines WL1 and WL2 may be disposed between inner side surfaces of the active pattern AP. The third insulating pattern 133 may be disposed between the first word line WL1 and the second word line WL2.

The first gate insulating pattern 141 may be disposed between each of the first and second word lines WL1 and WL2 and the active pattern AP. More particularly, the first gate insulating pattern 141 may be disposed between each of the first and second word lines WL1 and WL2 and the channel region CHR of the active pattern AP and between each of the first and second word lines WL1 and WL2 and the first dopant region SDR1 of the active pattern AP. The first and second word lines WL1 and WL2 may be spaced apart from each other with the active pattern AP and the first gate insulating pattern 141 interposed therebetween.

Referring to FIG. 6B, a semiconductor memory device according to some example embodiments of the inventive concepts may not include the back gate electrodes BG. The second insulating pattern 131 may be disposed between the active patterns AP. The first dopant region SDR1 of each of the active patterns AP may have a width greater than those of the channel region CHR and the second dopant region SDR2. A pair of the word lines WL, the channel region CHR and the second dopant region SDR2 may be disposed on each of the first dopant regions SDR1. The channel region CHR and the second dopant region SDR2 may be disposed between the pair of word lines WL.

The first gate insulating pattern 141 may be disposed between the first dopant region SDR1 and the pair of word lines WL and between the channel region CHR and the pair of word lines WL. The pair of word lines WL may be spaced apart from each other with the channel region CHR and the first gate insulating pattern 141 interposed therebetween. The third insulating pattern 133 may be disposed between the pair of word lines WL and another pair of the word lines WL adjacent thereto. The channel region CHR of each of the active patterns AP may be controlled by the pair of word lines WL adjacent to each other when the semiconductor memory device operates.

Figure 6C:
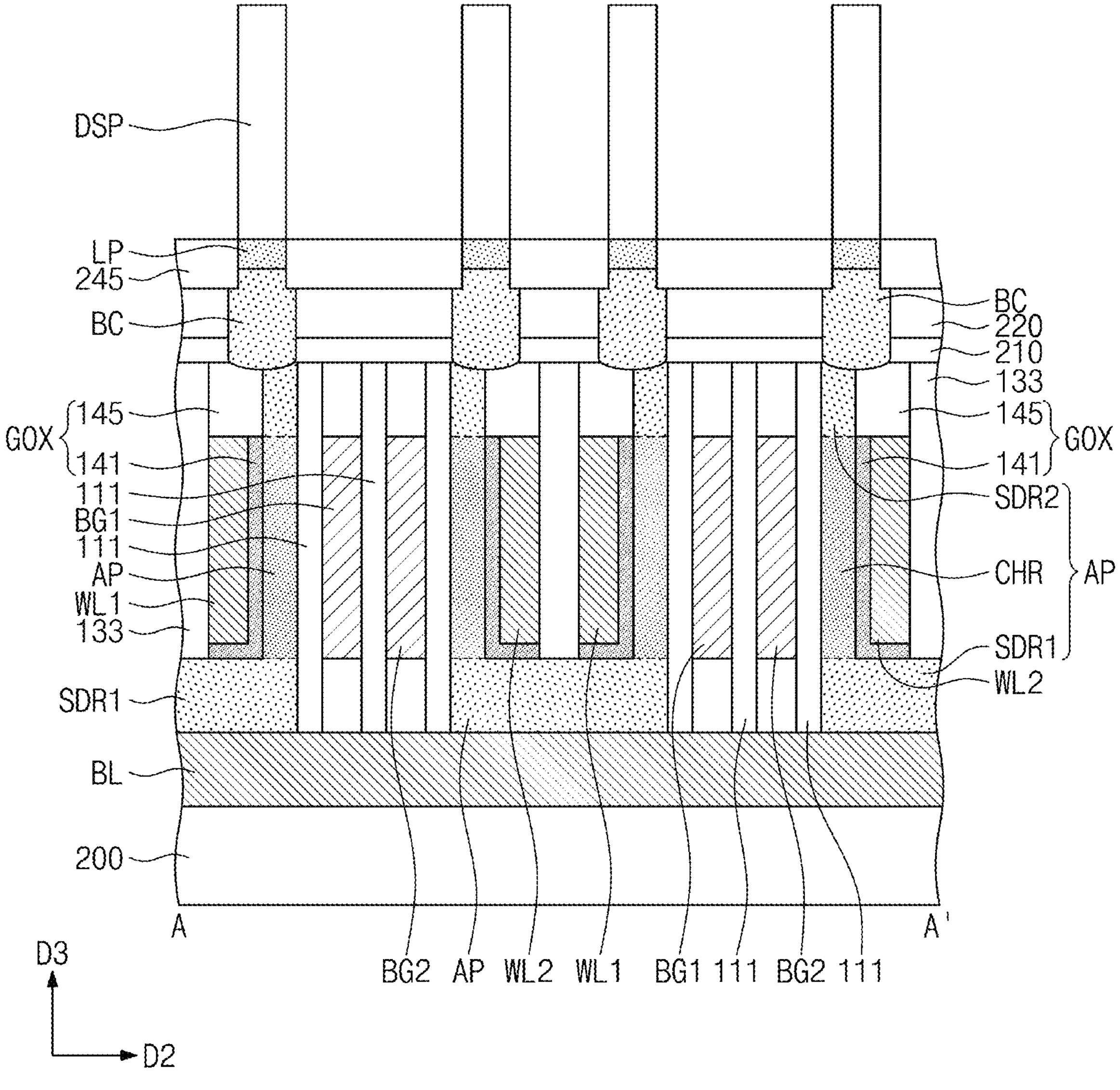
Figure 6D:
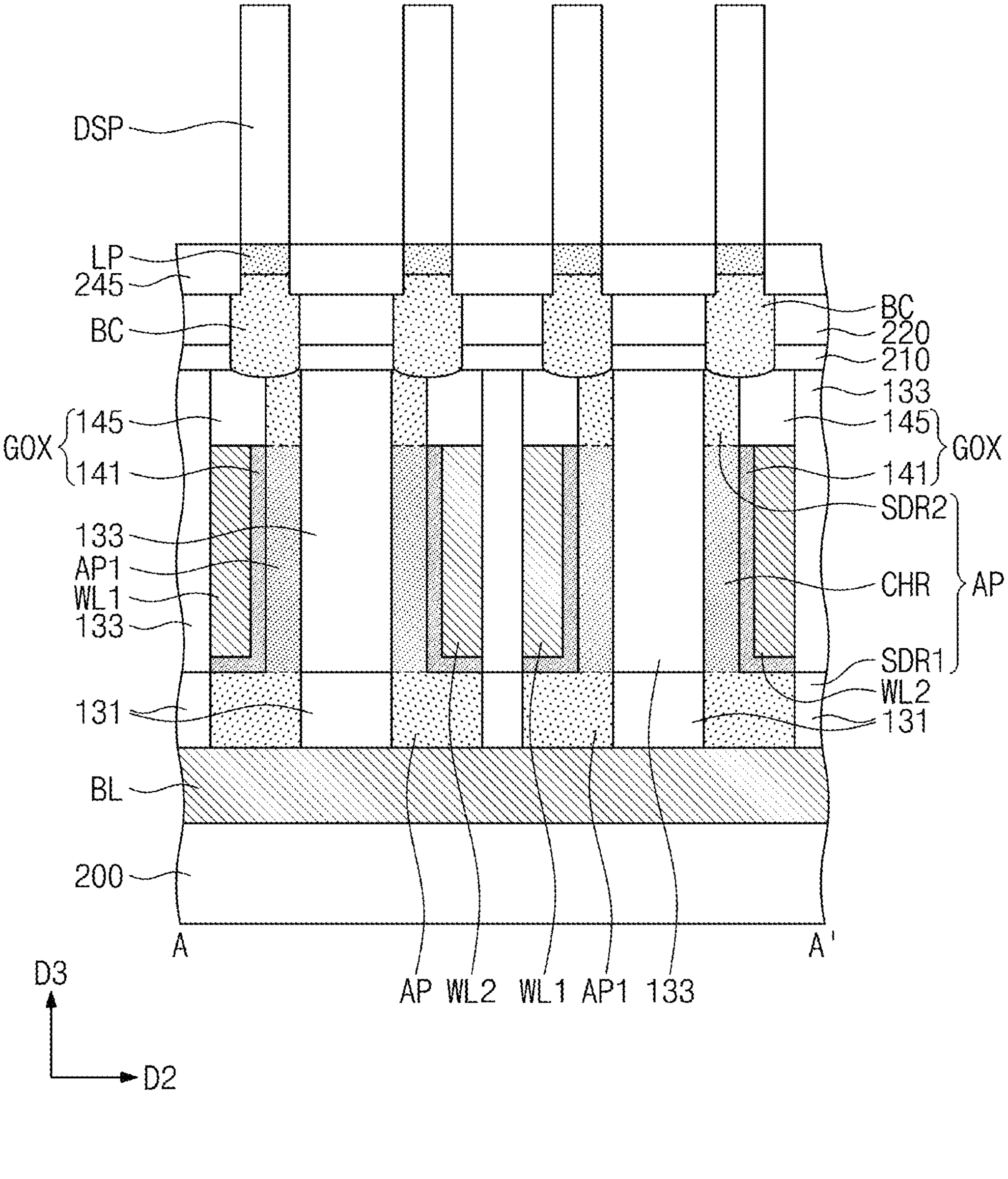

FIGS. 6C and 6D are cross-sectional views illustrating semiconductor memory devices according to some example embodiments of the inventive concepts. Hereinafter, the descriptions to the same features as mentioned with reference to FIGS. 1 to 3A and 6A will be omitted for the purpose of ease and convenience in explanation.

Referring to FIG. 6C, each of back gate electrodes BG may include a first back gate electrode BG1 and a second back gate electrode BG2. The first back gate electrode BG1 may be spaced apart from the second back gate electrode BG2 in the second direction D2. The first insulating pattern 111 may be disposed between the first back gate electrode BG1 and the second back gate electrode BG2.

Each of the channel regions CHR of the active patterns AP may be controlled by a corresponding one of the first and second word lines WL1 and WL2 and a corresponding one of the first and second back gate electrodes BG1 and BG2 when the semiconductor memory device operates. The first back gate electrode BG1 and the second back gate electrode BG2 may be controlled independently of each other.

Referring to FIG. 6D, a semiconductor memory device according to some example embodiments of the inventive concepts may not include the back gate electrodes BG. The second and third insulating patterns 131 and 133 may be disposed between the active patterns AP. The channel region CHR of each of the active patterns AP may be controlled by a corresponding word line WL adjacent thereto when the semiconductor memory device operates.

Figure 8:
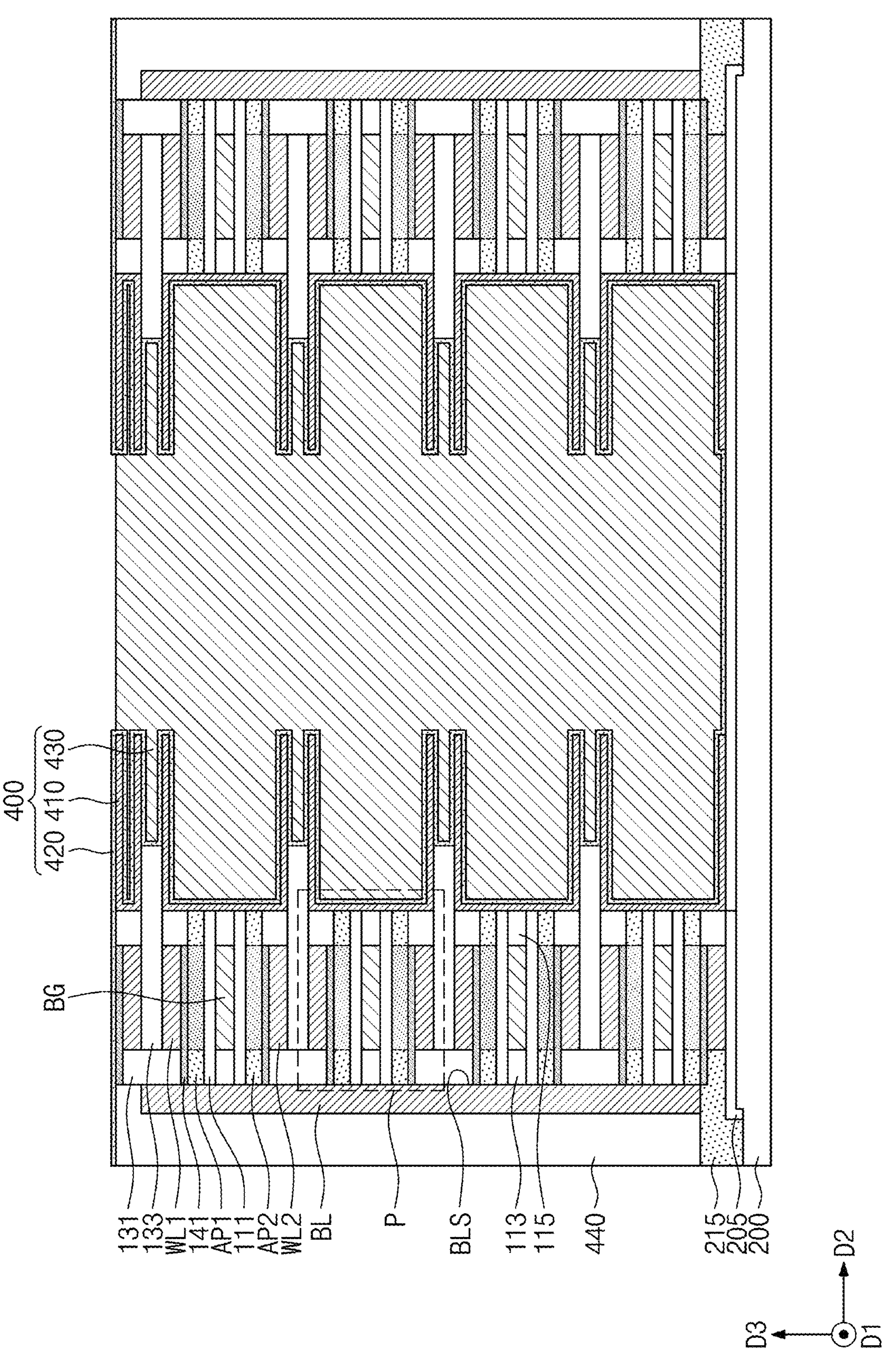
FIG. 8 is a cross-sectional view illustrating a semiconductor memory device according to some example embodiments of the inventive concepts.
Figure 9A:
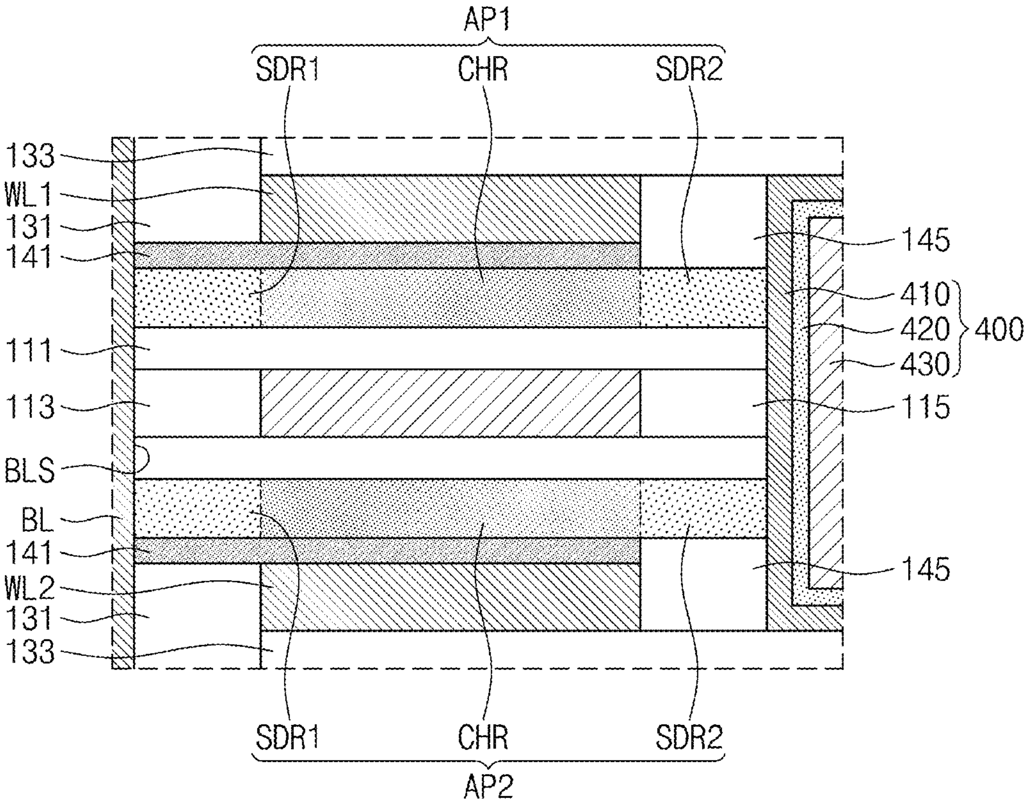
FIG. 9A is an enlarged view of a portion 'P' of FIG. 8 to illustrate a portion of a semiconductor memory device according to some example embodiments of the inventive concepts.

FIG. 8 is a cross-sectional view illustrating a semiconductor memory device according to some example embodiments of the inventive concepts. FIG. 9A is an enlarged view of a portion 'P' of FIG. 8 to illustrate a portion of a semiconductor memory device according to some example embodiments of the inventive concepts. Hereinafter, the descriptions to the same features as mentioned with reference to FIGS. 1 to 3A will be omitted for the purpose of ease and convenience in explanation.

Referring to FIGS. 8 and 9A, a lower insulating layer 205 may be disposed on a substrate 200. The substrate 200 may extend in a first direction D1 and a second direction D2. The lower insulating layer 205 may cover a portion of a top surface of the substrate 200. For example, the lower insulating layer 205 may include silicon oxide or silicon nitride.

Bit lines BL may be disposed on the substrate 200 and may be spaced apart from each other in the first direction D1 and the second direction D2. The bit lines BL may extend in a third direction D3. A filling insulation layer 440 may be disposed between the bit lines BL. The filling insulation layer 440 may extend in the first direction D1 to cover outer side surfaces of the bit lines BL. The filling insulation layer 440 may extend in the third direction D3 to cover top surfaces of the bit lines BL.

Active patterns AP may be disposed on inner side surfaces BLS of the bit lines BL. The active patterns AP may include first active patterns AP1 and second active patterns AP2. The first and second active patterns AP1 and AP2 may be alternately arranged in the third direction D3 on the inner side surface BLS of each of the bit lines BL. The first active patterns AP1 may be spaced apart from each other in the second direction D2, and the second active patterns AP2 may be spaced apart from each other in the second direction D2. In other words, the first and second active patterns AP1 and AP2 may be two-dimensionally arranged in the second direction D2 and the third direction D3 which intersect each other.

Back gate electrodes BG may be disposed on the inner side surfaces BLS of the bit lines BL and may be spaced apart from each other in the second direction D2 by a certain distance. The back gate electrodes BG may extend in the first direction D1 to intersect the bit lines BL. Each of the back gate electrodes BG may be disposed between the first and second active patterns AP1 and AP2 adjacent to each other in the third direction D3. A first insulating pattern 111 may be disposed between the first and second active patterns AP1 and AP2 adjacent to each other in the third direction D3.

A cell capacitor 400 may be connected to the first and second active patterns AP1 and AP2. The cell capacitor 400 may include a lower electrode layer 410, a capacitor dielectric layer 420, and an upper electrode layer 430. The capacitor dielectric layer 420 may conformally cover the lower electrode layer 410, and the upper electrode layer 430 may cover the capacitor dielectric layer 420 and may fill a space between active patterns spaced apart from each other in the second direction D2.

The lower electrode layer 410 may include a metal, a conductive metal nitride, a conductive metal silicide, or any combination thereof. For example, the lower electrode layer 410 may include a refractory metal such as cobalt, titanium, nickel, tungsten, and/or molybdenum. For example, the lower electrode layer 410 may include a metal nitride layer such as a titanium nitride layer, a titanium silicon nitride layer, a titanium aluminum nitride layer, a tantalum nitride layer, a tantalum silicon nitride layer, a tantalum aluminum nitride layer, and/or a tungsten nitride layer.

The capacitor dielectric layer 420 may be formed of at least one of a high-k dielectric material having a dielectric constant higher than that of silicon oxide, or a ferroelectric material. For example, the capacitor dielectric layer 420 may include at least one of a metal oxide or a dielectric material having a perovskite structure. In some example embodiments, the capacitor dielectric layer 420 may be formed of at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (SBT), bismuth iron oxide (BFO), strontium titanium oxide (SrTiO), yttrium oxide (YO), aluminum oxide (AlO), or lead scandium tantalum oxide (PbScTaO).

For example, the upper electrode layer 430 may be formed of doped silicon, Ru, RuO, Pt, PtO, Ir, IrO, SrRuO (SRO), (BaSr)RuO (BSRO), CaRuO (CRO), BaRuO, La(Sr,Co)O, Ti, TiN, W, WN, Ta, TaN, TiAlN, TiSiN, TaAlN, TaSiN, or any combination thereof.

A back gate capping pattern 113 may be disposed between each of the bit lines BL and each of the back gate electrodes BG. A back gate insulating pattern 115 may be disposed on the back gate electrode BG. The back gate insulating pattern 115 may fill a space between the back gate electrode BG and the lower electrode layer 410.

Channel regions CHR of the first and second active patterns AP1 and AP2 may overlap with the first and second word lines WL1 and WL2 and the back gate electrodes BG in the third direction D3. Gate insulating patterns GOX may be disposed on the inner side surfaces BLS of the bit lines BL. A first gate insulating pattern 141 may be disposed on the inner side surface BLS of the bit line BL. A second gate insulating pattern 145 may extend from the first gate insulating pattern 141 onto each of the first and second word lines WL1 and WL2 in the third direction D3. The second gate insulating pattern 145 may fill a space between the first gate insulating pattern 141 and the lower electrode layer 410 and between each of the first and second word lines WL1 and WL2 and the lower electrode layer 410.

A third insulating pattern 133 may be disposed on an inner side surface of the second insulating pattern 131. The third insulating pattern 133 may be disposed between the first and second word lines WL1 and WL2 adjacent to each other. The third insulating pattern 133 may extend in the second direction D2 and may fill a space between the second insulating pattern 131 and the lower electrode layer 410. The third insulating pattern 133 may laterally protrude from the second gate insulating pattern 145 and the active patterns AP.

The upper electrode layer 430 may extend in the second direction D2 to cover a top surface of an uppermost gate insulating pattern GOX and a top surface of the filling insulation layer 440. A lower capping layer 215 may be disposed between the substrate 200 and the filling insulation layer 440. The lower capping layer 215 may be a portion of a lowermost second insulating pattern 131, which extends in the second direction D2.

Figure 9B:
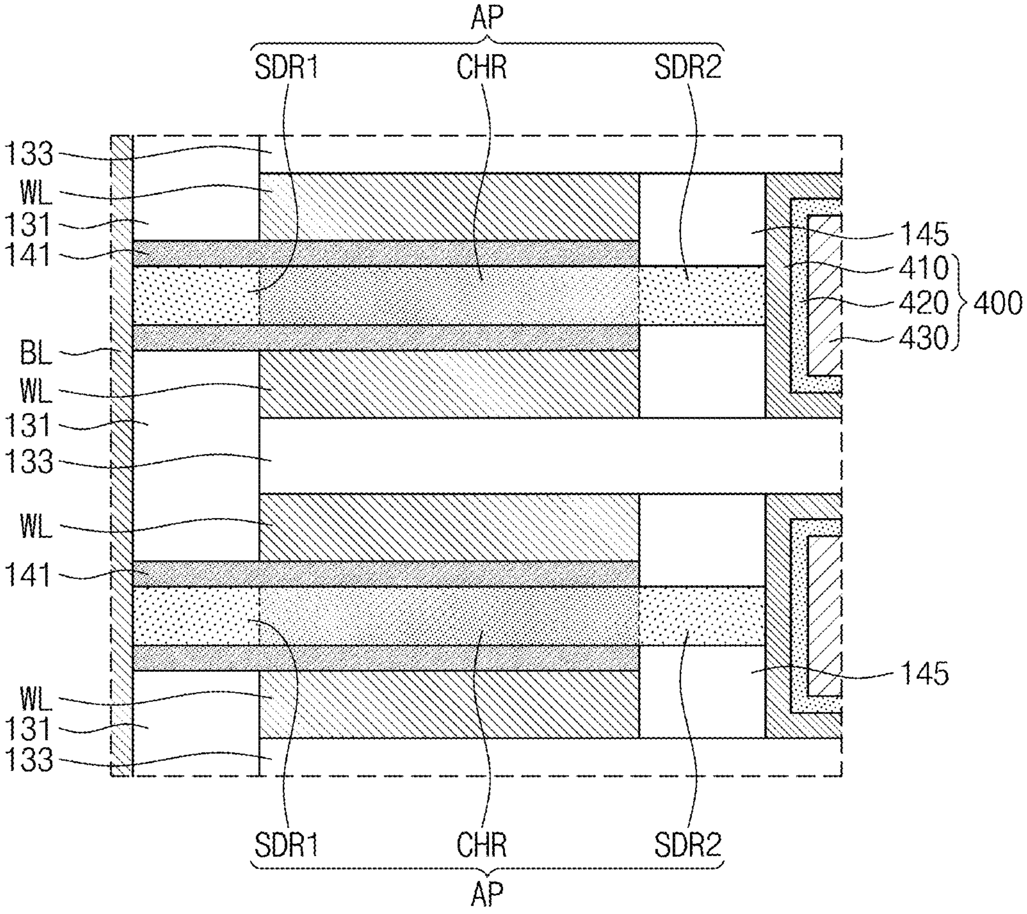
FIGS. 9B to 9D are cross-sectional views illustrating semiconductor memory devices according to some example embodiments of the inventive concepts.
Figure 9C:
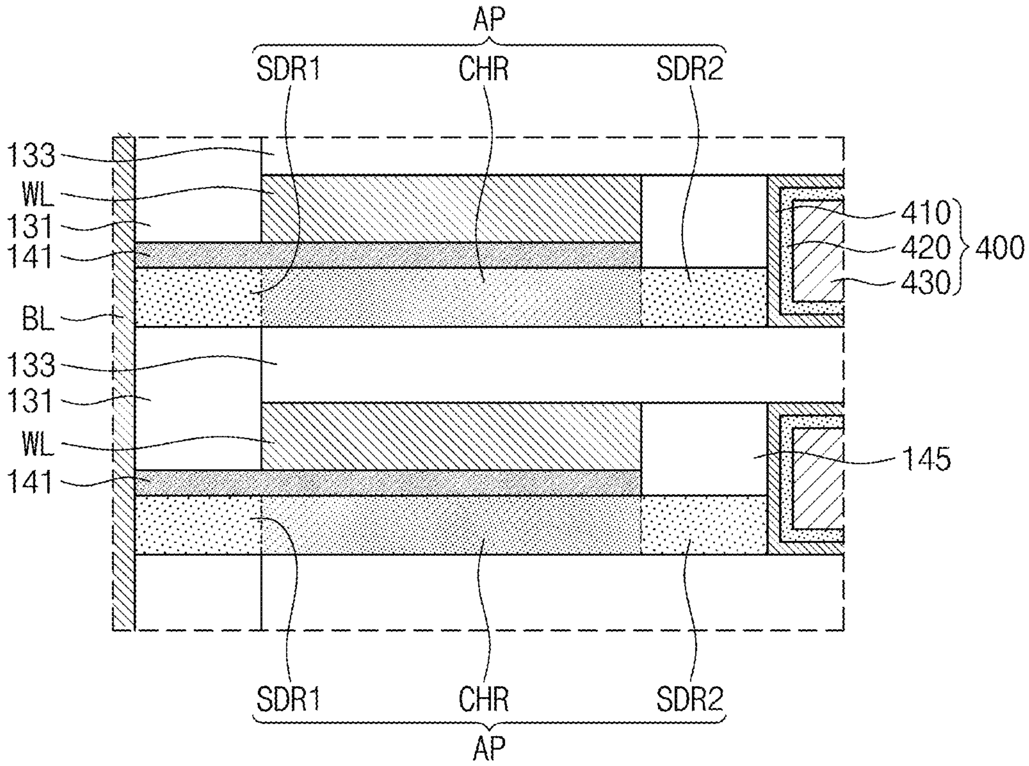
Figure 9D:
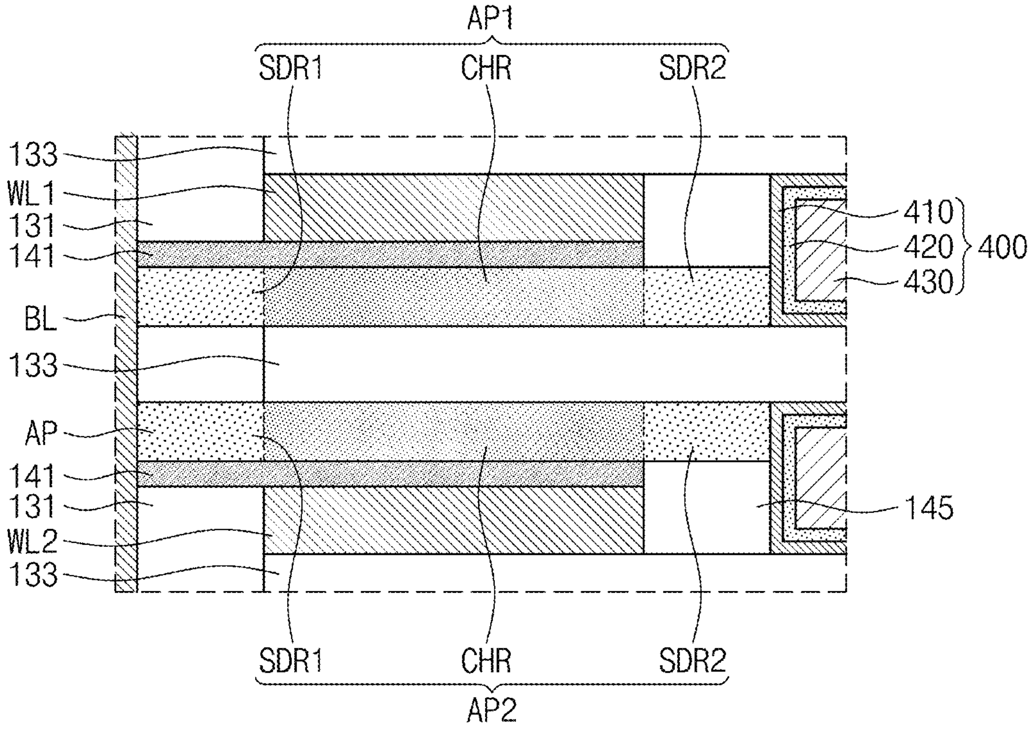

FIGS. 9B to 9D are cross-sectional views illustrating semiconductor memory devices according to some example embodiments of the inventive concepts. Hereinafter, the descriptions to the same features as mentioned with reference to FIGS. 1 to 3A, 8 and 9A will be omitted for the purpose of ease and convenience in explanation.

Referring to FIG. 9B, a semiconductor memory device according to some example embodiments of the inventive concepts may not include the back gate electrodes BG. Each of active patterns AP may be disposed between a pair of word lines WL. The first gate insulating pattern 141 may be disposed between each of the active patterns AP and each of the word lines WL. The channel region CHR of each of the active patterns AP may be controlled by the pair of word lines WL adjacent to each other when the semiconductor memory device operates.

Referring to FIG. 9C, a semiconductor memory device may not include the back gate electrodes BG. The active patterns AP and the word lines WL may be alternately arranged. Each of the active patterns AP may be adjacent to a corresponding one of the word lines WL, and the first gate insulating pattern 141 may be disposed between each of the active patterns AP and the corresponding word line WL. The first gate insulating pattern 141 may be disposed on one surface of each of the active patterns AP. The third insulating pattern 133 may be disposed on another surface of each of the active patterns AP. The channel regions CHR of the active patterns AP may be controlled by the word lines WL when the semiconductor memory device operates.

Referring to FIG. 9D, a semiconductor memory device may not include the back gate electrodes BG. The first insulating pattern 111 may be disposed between a pair of the first and second active patterns AP1 and AP2 adjacent to each other. The channel regions CHR of the first active patterns AP1 may be controlled by the first word lines WL1 when the semiconductor memory device operates. The channel regions CHR of the second active patterns AP2 may be controlled by the second word lines WL2 when the semiconductor memory device operates.

The semiconductor memory device according to the example embodiments of the inventive concepts may include the high-k dielectric material between the channel region of the active pattern and the word line. The high-k dielectric material between the channel region and the word line may allow the channel region to be well controlled by the word line when the semiconductor memory device operates. In addition, the side surface of the second dopant region adjacent to the contact pattern may be covered with the insulating material, not the high-k dielectric material, and thus it is possible to minimize, prevent, or reduce in likelihood a leakage current (e.g., a gate induced drain leakage) caused by the word lines. As a result, the semiconductor memory device with improved electrical characteristics and reliability may be provided.

While the example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device comprising:

a bit line extending in a first direction;

a first word line and a second word line which extend in a second direction intersecting the first direction on the bit line, and the first word line and the second word line are spaced apart from each other in the first direction;

a back gate electrode extending in the second direction between the first word line and the second word line;

a first active pattern between the first word line and the back gate electrode;

a second active pattern between the second word line and the back gate electrode;

contact patterns connected to the first active pattern and the second active pattern, respectively; and a first gate insulating pattern between the first active pattern and the first word line and between the second active pattern and the second word line, wherein a top surface of the first gate insulating pattern is located at substantially a same height as a top surface of the first word line and a top surface of the second word line, and wherein the first gate insulating pattern includes a high-k dielectric material.

2. The semiconductor memory device of claim 1, wherein the first gate insulating pattern includes at least one of aluminum oxide (AlO), tantalum oxide (TaO), titanium oxide (TiO), zirconium oxide (ZrO), or hafnium oxide (HfO).

3. The semiconductor memory device of claim 1, wherein the first gate insulating pattern extends to a top surface of the bit line in a third direction perpendicular to the first direction and the second direction.

4. The semiconductor memory device of claim 1, wherein each of the first active pattern and the second active pattern includes, a first dopant region adjacent to the bit line;

a second dopant region adjacent to the contact patterns; and a channel region between the first dopant region and the second dopant region, and wherein the first gate insulating pattern is disposed between the first word line and the channel region of the first active pattern and between the second word line and the channel region of the second active pattern.

5. The semiconductor memory device of claim 4, wherein the first gate insulating pattern extends in a third direction perpendicular to the first direction and the second direction to cover a side surface of the first dopant region of the first active pattern and a side surface of the first dopant region of the second active pattern.

6. The semiconductor memory device of claim 4, further comprising:

a second gate insulating pattern on the first gate insulating pattern, wherein the second gate insulating pattern covers a side surface of the second dopant region of the first active pattern and a side surface of the second dopant region of the second active pattern, and wherein the second gate insulating pattern includes silicon oxide or a low-k dielectric material.

7. The semiconductor memory device of claim 6, wherein the low-k dielectric material includes at least one of SiOC, air, SiOCN, SiON, SiO, SiOCH, or SiOF.

8. The semiconductor memory device of claim 4, wherein the channel region of the first active pattern is disposed between the first word line and the back gate electrode, and wherein the channel region of the second active pattern is disposed between the second word line and the back gate electrode.

9. The semiconductor memory device of claim 1, wherein the back gate electrode includes a first back gate electrode and a second back gate electrode, and wherein the first back gate electrode and the second back gate electrode are spaced apart from each other in the first direction.

10. A semiconductor memory device comprising:

a bit line extending in a first direction;

word lines extending in a second direction intersecting the first direction on the bit line and spaced apart from each other in the first direction;

a back gate electrode extending in the second direction between the word lines;

active patterns, each of which is between each of the word lines and the back gate electrode;

contact patterns connected to the active patterns, respectively; and a gate insulating pattern covering a side surface of each of the active patterns, wherein the gate insulating pattern includes, a first gate insulating pattern on a top surface of the bit line; and a second gate insulating pattern on the first gate insulating pattern, and wherein the first gate insulating pattern includes a material having a dielectric constant higher than that of the second gate insulating pattern.

11. The semiconductor memory device of claim 10, wherein a top surface of the first gate insulating pattern is located at substantially a same height as top surfaces of the word lines.

12. The semiconductor memory device of claim 10, wherein the first gate insulating pattern is in direct contact with the second gate insulating pattern, and wherein the second gate insulating pattern extends onto a top surface of each of the word lines in the first direction.

13. The semiconductor memory device of claim 10, wherein the first gate insulating pattern includes at least one of aluminum oxide (AlO), tantalum oxide (TaO), titanium oxide (TiO), zirconium oxide (ZrO), or hafnium oxide (HfO), and wherein the second gate insulating pattern includes silicon oxide or a low-k dielectric material.

14. The semiconductor memory device of claim 10, wherein each of the active patterns includes, a channel region between each of the word lines and the back gate electrode;

a first dopant region between the channel region and the bit line; and a second dopant region between each of the contact patterns and the channel region, wherein the first gate insulating pattern covers side surfaces of the channel region and the first dopant region, and wherein the second gate insulating pattern covers a side surface of the second dopant region.

15. The semiconductor memory device of claim 10, further comprising:

a back gate insulating pattern between the back gate electrode and each of the active patterns, wherein the back gate insulating pattern includes a low-k dielectric material.

16. A semiconductor memory device comprising:

a substrate;

a bit line extending in a first direction on the substrate;

word lines extending in a second direction intersecting the first direction on the bit line and spaced apart from each other in the first direction;

active patterns between the word lines on the bit line;

contact patterns connected to the active patterns, respectively; and a gate insulating pattern between each of the active patterns and an adjacent one of the word lines, wherein the gate insulating pattern includes, a first gate insulating pattern on a top surface of the bit line; and a second gate insulating pattern on the first gate insulating pattern, and wherein the first gate insulating pattern includes a material having a dielectric constant higher than that of the second gate insulating pattern and the second gate insulating pattern includes silicon oxide or a material having a dielectric constant lower than silicon oxide.

17. The semiconductor memory device of claim 16, wherein the first gate insulating pattern is in direct contact with the second gate insulating pattern.

18. The semiconductor memory device of claim 16, wherein the first gate insulating pattern includes at least one of aluminum oxide (AlO), tantalum oxide (TaO), titanium oxide (TiO), zirconium oxide (ZrO), or hafnium oxide (HfO).

19. The semiconductor memory device of claim 16, wherein each of the active patterns includes, a channel region overlapping with the word lines in the first direction;

a first dopant region between the channel region and the bit line; and a second dopant region between each of the contact patterns and the channel region, wherein the first gate insulating pattern covers side surfaces of the channel region and the first dopant region, and wherein the second gate insulating pattern covers a side surface of the second dopant region.

20. The semiconductor memory device of claim 19, wherein dopant concentrations in the first dopant region and the second dopant region are higher than a dopant concentration in the channel region.

* * * * *